(12) United States Patent
Shin et al.

(10) Patent No.: US 10,928,723 B2
(45) Date of Patent: Feb. 23, 2021

(54) PELLICLE FOR PHOTOMASK, RETICLE INCLUDING THE SAME, AND EXPOSURE APPARATUS FOR LITHOGRAPHY

(71) Applicant: Samsung Electronics Co., Ltd., Suwon-si (KR)

(72) Inventors: Hyeonjin Shin, Suwon-si (KR); Hyunjae Song, Hwaseong-si (KR); Seongjun Park, Seoul (KR); Keunwook Shin, Yongin-si (KR); Changseok Lee, Seoul (KR); Dongwook Lee, Wonju-si (KR); Minsu Seol, Seoul (KR); Sangwon Kim, Seoul (KR); Seongjun Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/708,969

(22) Filed: Dec. 10, 2019

(65) Prior Publication Data

US 2020/0117078 A1    Apr. 16, 2020

Related U.S. Application Data

(63) Continuation of application No. 15/807,106, filed on Nov. 8, 2017, now Pat. No. 10,539,868.

(30) Foreign Application Priority Data

Nov. 30, 2016 (KR) .......................... 10-2016-0162297

(51) Int. Cl.
*G03F 1/64* (2012.01)
*G03F 1/62* (2012.01)
*G03F 1/22* (2012.01)

(52) U.S. Cl.
CPC .................. *G03F 1/64* (2013.01); *G03F 1/22* (2013.01); *G03F 1/62* (2013.01)

(58) Field of Classification Search
USPC ........................................................ 430/5
See application file for complete search history.

(56) References Cited

U.S. PATENT DOCUMENTS

| | | | |
|---|---|---|---|
| 7,524,616 B2 | 4/2009 | Chen et al. |
| 9,360,749 B2 | 6/2016 | Lin et al. |
| 9,703,186 B2 | 7/2017 | Kim et al. |
| 10,191,367 B2 | 1/2019 | Song et al. |
| 2010/0195076 A1 | 8/2010 | Mueller et al. |
| 2012/0321545 A1 | 12/2012 | Jeon et al. |
| 2013/0088699 A1 | 4/2013 | Yakunin et al. |
| 2013/0250260 A1 | 9/2013 | Singh |
| 2014/0160455 A1 | 6/2014 | Yakunin et al. |
| 2015/0235959 A1 | 8/2015 | Lee et al. |
| 2015/0309404 A1 | 10/2015 | Lin et al. |
| 2016/0139500 A1 | 5/2016 | Kim et al. |
| 2016/0147141 A1 | 5/2016 | Ono et al. |
| 2016/0148369 A1 | 5/2016 | Jeong et al. |
| 2016/0201201 A1 | 7/2016 | Kim et al. |
| 2017/0017150 A1 | 1/2017 | Yakunin et al. |
| 2017/0038675 A1 | 2/2017 | Ahn et al. |
| 2017/0090278 A1 | 3/2017 | Chiu et al. |
| 2018/0149966 A1 | 5/2018 | Shin et al. |

FOREIGN PATENT DOCUMENTS

| | | |
|---|---|---|
| EP | 2518563 A1 | 10/2012 |
| EP | 3007206 A1 | 4/2016 |
| EP | 3151064 A2 | 4/2017 |
| EP | 3 330 796 A1 | 6/2018 |
| JP | 2001255644 A | 9/2001 |
| JP | 5788590 B2 | 9/2015 |
| KR | 10-2014-0027562 A | 3/2014 |
| KR | 10-2014-0038985 A | 3/2014 |
| KR | 20140038985 A | 3/2014 |
| KR | 10-2015-0121292 A | 10/2015 |
| KR | 10-2015-0123145 A | 11/2015 |
| KR | 20150123145 A | 11/2015 |
| KR | 10-2016-0058306 A | 5/2016 |
| KR | 20160058306 A | 5/2016 |
| KR | 10-2016-0086024 A | 7/2016 |
| KR | 101813185 B1 | 1/2018 |
| WO | WO-2005/029180 A2 | 3/2005 |
| WO | WO-2013/174656 A2 | 11/2013 |
| WO | WO-2017/067813 A2 | 4/2017 |

OTHER PUBLICATIONS

Second Notice of Allowance dated Feb. 20, 2020, issued in co-pending U.S. Appl. No. 15/917,947.
McConnell, et al. "Thermal Conductivity of Doped Polysilicon Layers," Journal of Microelectromechanical Systems, vol. 10, No. 3, pp. 360-369 (2001).
Korean Office Action dated May 8, 2017 issued in corresponding Korean Application No. 10-2016-0162297.
Vanpaemel, et al. "Alternative membrane development at imec" Aspire Invent Achieve, pp. 1-20 (2016).
Extended European Search Report dated Apr. 26, 2018 issued in corresponding European Application No. 17201726.1.
Korean Office Action dated May 8, 2017 issued in corresponding Korean Application No. 10-2016-0162297 (English translation provided).
U.S. Office Action dated Jul. 3, 2018 issued in copending U.S. Appl. No. 15/917,947.
Lee, J.U. et al., "Introducing the EUV CNT pellicle," Proceedings of the SPIE, vol. 9985, 2016.
Extended European Search Report for EP Appl. No. 17203361.5 dated Jul. 5, 2018.

(Continued)

*Primary Examiner* — Christopher G Young
(74) *Attorney, Agent, or Firm* — Harness, Dickey & Pierce, P.L.C.

(57) ABSTRACT

A pellicle for a photomask, a reticle including the same, and an exposure apparatus for lithography are provided. The pellicle may include a pellicle membrane, and the pellicle membrane may include nanocrystalline graphene. The nanocrystalline graphene may have defects. The nanocrystalline graphene may include a plurality of nanoscale crystal grains, and the nanoscale crystal grains may include a two-dimensional (2D) carbon structure having an aromatic ring structure. The defects of the nanocrystalline graphene may include at least one of an sp3 carbon atom, an oxygen atom, a nitrogen atom, or a carbon vacancy.

34 Claims, 20 Drawing Sheets

(56) References Cited

OTHER PUBLICATIONS

Final Office Action dated Nov. 29, 2018 for copending U.S. Appl. No. 15/917,947.
Notice of Allowance dated Apr. 15, 2019, issued in copending U.S. Appl. No. 15/917,947.
Office Action dated Jun. 11, 2019, issued in co-pending U.S. Appl. No. 15/807,106.
Gao et al., "Extreme ultraviolet induced defects on few-layer graphene" Journal of Applied Physics, Jul. 2013 (DOI 10.1063.1/1.4817082).
Notice of Allowance dated Sep. 4, 2019, issued in corresponding U.S. Appl. No. 15/807,106.

FIG. 6
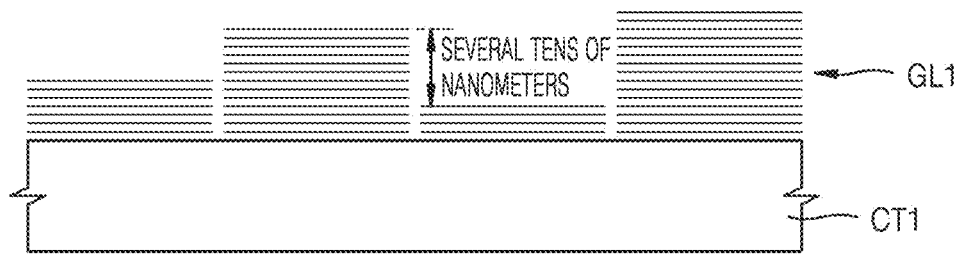
< COMPARATIVE EXAMPLE >
FIG. 7A                FIG. 7B
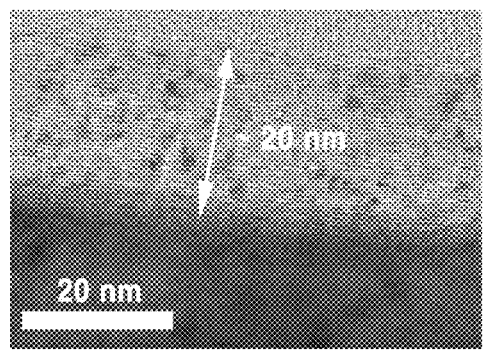 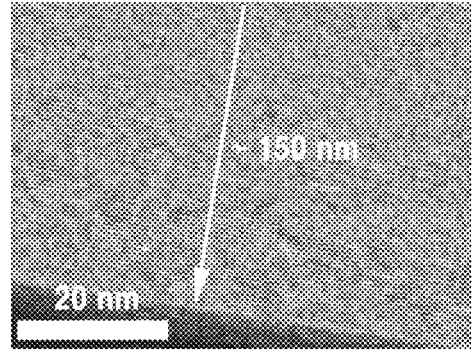
< COMPARATIVE EXAMPLE >

PELLICLE FOR PHOTOMASK, RETICLE INCLUDING THE SAME, AND EXPOSURE APPARATUS FOR LITHOGRAPHY

CROSS-REFERENCE TO RELATED APPLICATION

This application is a continuation application of U.S. application Ser. No. 15/807,106, filed on Nov. 8, 2017, which claims the benefit of Korean Patent Application No. 10-2016-0162297, filed on Nov. 30, 2016, in the Korean Intellectual Property Office, the disclosure of each of which is incorporated herein in its entirety by reference.

BACKGROUND

1. Field

The present disclosure relates to a pellicle for a photomask, a reticle including the same, and an exposure apparatus for lithography.

2. Description of Related Art

A pellicle for a photomask may be provided in the form of a film on a photomask so as to protect the photomask from external contaminants (for example, dust, resist, or the like) during optical lithography. Such a pellicle may have high transmittance with respect to light used in a lithography process and other features (e.g., heat dissipation characteristics, strength, uniformity, durability, stability, and the like) for the lithography process. As a line width of semiconductor devices and electronic circuits has been reduced, a wavelength of light used in a lithography process may become shorter.

SUMMARY

Provided is a pellicle for a photomask, the pellicle having high light transmittance and excellent characteristics in various aspects.

Provided is a pellicle for a photomask, the pellicle having excellent characteristics in terms of uniformity, durability, stability, thermal conductivity, strength, and the like.

Provided is a pellicle for a photomask. The pellicle may have high transmittance and excellent resistance and durability with respect to short-wavelength light such as extreme ultraviolet (EUV) light.

Provided is a pellicle for a photomask. The pellicle may have excellent surface uniformity.

Provided is a reticle including the pellicle.

Provided is a lithography apparatus to which the reticle including the pellicle is applied.

Additional aspects will be set forth in part in the description which follows and, in part, will be apparent from the description, or may be learned by practice of the presented embodiments.

According to some example embodiments of inventive concepts, a pellicle for protecting a photomask includes a pellicle membrane including nanocrystalline graphene having defects.

In some example embodiments, the nanocrystalline graphene may include a plurality of nanoscale crystal grains, and the plurality of nanoscale crystal grains may include a two-dimensional (2D) carbon structure having an aromatic ring structure.

In some example embodiments, defects of the nanocrystalline graphene may include at least one of an sp3 carbon (C) atom, an oxygen (O) atom, a nitrogen (N) atom, or a carbon vacancy.

In some example embodiments, a D/G intensity ratio in a Raman spectrum of the nanocrystalline graphene may be about 0.5 or more.

In some example embodiments, a 2D/G intensity ratio in a Raman spectrum of the nanocrystalline graphene may be about 0.05 or more.

In some example embodiments, an amount of oxygen (O) in the nanocrystalline graphene may be in a range of about 1 at % to about 20 at %.

In some example embodiments, an amount of hydrogen (H) in the nanocrystalline graphene may be in a range of about 1 at % to about 20 at %.

In some example embodiments, an amount of nitrogen (N) in the nanocrystalline graphene may be in a range of about 1 at % to about 20 at %.

In some example embodiments, the nanocrystalline graphene may include an irregular lattice structure in a C-axis direction.

In some example embodiments, the nanocrystalline graphene may have a density of less than about 2.2 g/cm$^3$.

In some example embodiments, interlayer spacing (d-spacing) of the nanocrystalline graphene, as obtained through X-ray diffraction analysis, may be greater than about 3.35 Å.

In some example embodiments, the nanocrystalline graphene may have a surface roughness of less than about 10 nm.

In some example embodiments, the pellicle membrane may have a thickness of about 100 nm or less.

In some example embodiments, the pellicle membrane may have a transmittance of about 80% or more with respect to extreme ultraviolet (EUV) light. The pellicle membrane may have a transmittance of about 90% or more with respect to EUV light.

In some example embodiments, the pellicle membrane may further include a protective layer on at least one surface of the nanocrystalline graphene.

In some example embodiments, the protective layer may include at least one of a carbon-based material, a metal chalcogenide-based material, a silicon derivative, or a metal oxide.

In some example embodiments, the carbon-based material may include at least one of amorphous carbon, graphene, nano-graphite, carbon nanosheet, carbon nanotube, silicon carbide (SiC), or boron carbide (B4C).

In some example embodiments, the metal chalcogenide-based material may include a transition metal dichalcogenide (TMD).

In some example embodiments, the metal chalcogenide-based material may include a metal and a chalcogen element. The metal may include one of Mo, W, Nb, V, Ta, Ti, Zr, Hf, Tc, Re, Cu, Ga, In, Sn, Ge, and Pb. The chalcogen element may include one of S, Se, and Te.

In some example embodiments, the pellicle may include a protective layer on at least one surface of the nanocrystalline graphene. The protective layer may include a silicon derivative. The silicon derivative may include at least one of Si, SiOx, or SixNy.

In some example embodiments, the pellicle may include a protective layer on at least one surface of the nanocrystalline graphene. The protective layer may include a metal oxide. The metal oxide may include an oxide of Hf, Al, Mg, Zr, Cu, Ni, Zn, or Ti.

In some example embodiments, the pellicle membrane may be spaced apart from the photomask by about 1 mm to about 10 mm.

In some example embodiments, the pellicle may include a pellicle frame supporting the pellicle membrane. The pellicle frame may be at an edge portion of the pellicle membrane.

In some example embodiments, the pellicle may further include a bonding layer between the pellicle membrane and the pellicle frame.

According to some example embodiments of inventive concepts, a reticle includes a photomask and the above-described pellicle configured to protect the photomask.

In some example embodiments, the reticle may be a transmissive reticle.

In some example embodiments, the reticle may be a reflective reticle.

In some example embodiments, the reticle may be a reticle for extreme ultraviolet (EUV) lithography.

According to some example embodiments of inventive concepts, an exposure apparatus for lithography includes: a light source configured to generate light; and a reticle in a traveling path of the light generated by the light source. The reticle may include the above-described pellicle and the photomask. The photomask may have a pattern to be transferred onto a substrate. The pellicle may be configured to protect the photomask.

In some example embodiments, the exposure apparatus may further include at least one optical member between the reticle and corresponding one of the light source and the substrate.

In some example embodiments, the exposure apparatus may be an EUV exposure apparatus.

According to some example embodiments, a pellicle for protecting a photomask may include a structure of the pellicle, and a pellicle membrane connected to the structure of the pellicle. The pellicle membrane may include nanocrystalline graphene having defects.

In some example embodiments, the structure of the pellicle may be a pellicle frame. The pellicle frame may be disposed at an edge portion of the pellicle membrane.

In some example embodiments, the defects of the nanocrystalline graphene may include at least one of an sp3 carbon (C) atom, an oxygen (O) atom, a nitrogen (N) atom, or a carbon vacancy.

In some example embodiments, the nanocrystalline graphene may include oxygen (O) in a range of about 1 at % to about 20 at %, hydrogen (H) in a range of about 1 at % to about 20 at %, or nitrogen (N) in a range of about 1 at % to about 20 at %.

In some example embodiments, a reticle may include the photomask and the above-described pellicle.

BRIEF DESCRIPTION OF THE DRAWINGS

These and/or other aspects will become apparent and more readily appreciated from the following description of some example embodiments, taken in conjunction with the accompanying drawings in which:

FIG. 6 is a cross-sectional view for describing a structure of a graphene layer according to a comparative example;

FIGS. 7A and 7B are cross-sectional images showing a thickness deviation of a graphene layer formed on different regions of a catalyst metal layer, according to a comparative example;

DETAILED DESCRIPTION

Figure 1:
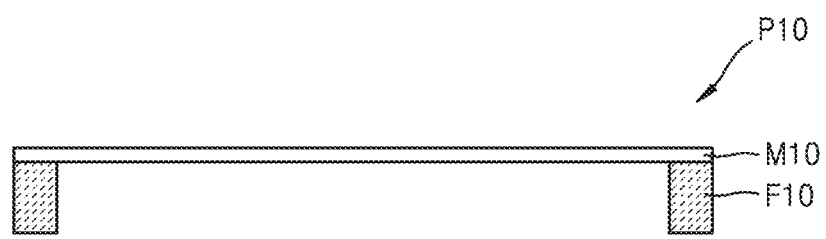
FIG. 1 is a cross-sectional view of a pellicle for a photomask, according to some example embodiments of inventive concepts.

Reference will now be made in detail to some example embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of" when preceding a list of elements, modify the entire list of elements and do not modify the individual elements of the list.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edge portions rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, pellicles for photomasks, reticles including the same, and exposure apparatuses for lithography, according to some example embodiments, will be described in detail with reference to the accompanying drawings. Widths and thicknesses of layers or regions in the drawings may be exaggerated for clarity and convenience of explanation. Like reference numerals are assigned to like elements throughout the drawings and the specification.

FIG. 1 is a cross-sectional view of a pellicle P10 for a photomask, according to some example embodiments of inventive concepts.

Referring to FIG. 1, the pellicle P10 may include a pellicle membrane M10. The pellicle membrane M10 may include nanocrystalline graphene having defects. In other words, a constituent material (or a main constituent material) of the pellicle membrane M10 may be nanocrystalline graphene. The nanocrystalline graphene may include a plurality of nanoscale crystal grains. The crystal grains may include a "two-dimensional (2D) carbon structure" having an aromatic ring structure. A size (length/diameter) of each of the crystal grains may be several hundreds of nm or less (e.g., about 300 nm or less), for example, greater than 0 nm and about 100 nm or less. The 2D carbon structure included in the crystal grains may have a layered structure in which carbon atoms are two-dimensionally arranged. Defects included in the nanocrystalline graphene may include at least one selected from an sp3 carbon (C) atom, an oxygen (O) atom, a nitrogen (N) atom, and a carbon vacancy.

The pellicle P10 may further include one or more other structures. For example, the pellicle P10 may include a pellicle supporting structure such as a frame F10 to support the pellicle membrane M10. Due to the pellicle frame F10, the pellicle membrane M10 may be spaced apart from a photomask (not illustrated) by a certain interval. The pellicle frame F10 may be disposed at an edge portion of the pellicle membrane M10. When viewed from above, the pellicle frame F10 may have a rectangular or circular frame structure or other various shapes.

Hereinafter, the nanocrystalline graphene of the pellicle membrane M10 will be described in detail with reference to FIGS. 2 and 3A to 3E.

Figure 2:
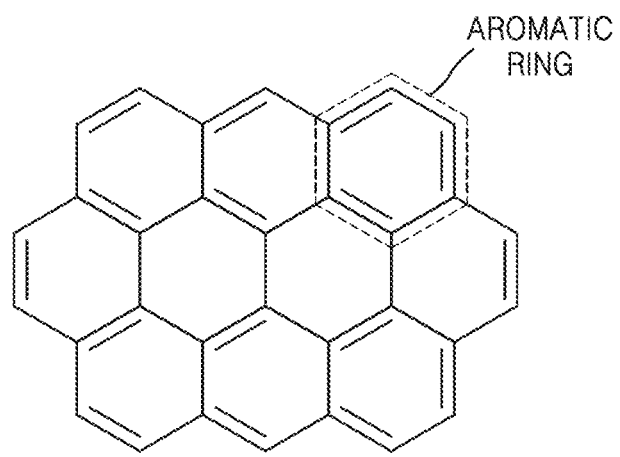
FIG. 2 illustrates a chemical structure for describing a crystal grain of nanocrystalline graphene applicable to a pellicle membrane of FIG. 1.

FIG. 2 illustrates a chemical structure of the crystal grain of the nanocrystalline graphene applicable to the pellicle membrane M10 of FIG. 1. In the case of FIG. 2, it is assumed that the crystal grain does not include defect(s), but an actual crystal grain may include defect(s).

Referring to FIG. 2, the crystal grain may include a "2D carbon structure" having an aromatic ring structure. Carbon atoms may form an aromatic ring structure, and such ring structures (annular structures) may be two-dimensionally arranged. A size of the crystal grain may be nanoscale. A size (length/diameter) of the crystal grain may be several hundreds of nm or less (e.g., about 300 nm or less), for example, about 100 nm or less. The size, shape, and structure of the crystal grain illustrated in FIG. 2 are merely examples and may be variously changed. Also, although not illustrated in FIG. 2 for convenience, an actual crystal grain may include defect(s). Possible defects of the crystal grain will be described with reference to FIGS. 3A to 3E.

FIGS. 3A to 3E illustrate chemical structures for describing various possible defects of the nanocrystalline graphene applicable to the pellicle membrane M10 of FIG. 1. In other words, FIGS. 3A to 3E illustrate possible defects of the crystal grain of FIG. 2.

Figure 3A:
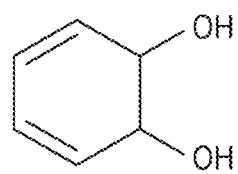
FIGS. 3A to 3E illustrate chemical structures for describing various possible defects of nanocrystalline graphene applicable to the pellicle membrane of FIG. 1.

FIG. 3A illustrates a case where some carbon atoms forming an aromatic ring structure become sp3 carbons when double bonds thereof are broken, and hydroxy groups (OH) are bonded to the sp3 carbons. Carbon atoms maintaining double bonds in the aromatic ring structure may be referred to as sp2 carbons. Since all carbon atoms constituting general graphene may be sp2 carbons, the sp3 carbons may be regarded as defects of graphene. Also, a functional group (or a substituent) such as the hydroxy group (OH) bonded to the sp3 carbon may be regarded as defects.

Figure 3B:
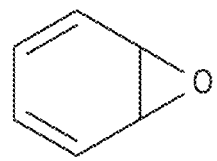

FIG. 3B illustrates a case where some carbon atoms forming an aromatic ring structure become sp3 carbons when double bonds thereof are broken, and an oxygen (O) atom is bonded to the sp3 carbons. The oxygen (O) atom may be bonded to two adjacent sp3 carbons. Such an oxygen (O) atom may be referred to as an epoxy group.

Figure 3C:
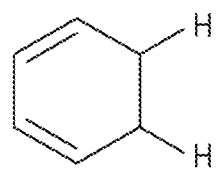

FIG. 3C illustrates a case where some carbon atoms forming an aromatic ring structure become sp3 carbons when double bonds thereof are broken, and hydrogen (H) atoms are bonded to the sp3 carbons. In some cases, a hydrogen (H) atom may be bonded to one of the two adjacent sp3 carbons, and a hydroxy group (OH) may be bonded to the other.

Figure 3D:
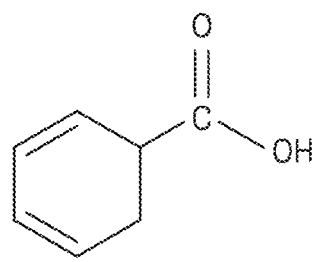

FIG. 3D illustrates a case where some carbon atoms forming an aromatic ring structure become sp3 carbons when double bonds thereof are broken, and a carboxyl group (COOH) is bonded to the sp3 carbon. Since the carboxyl group (COOH) may include a carbonyl group (C=O), it can also be said that the carbonyl group (C=O) is bonded to the sp3 carbon.

Figure 3E:
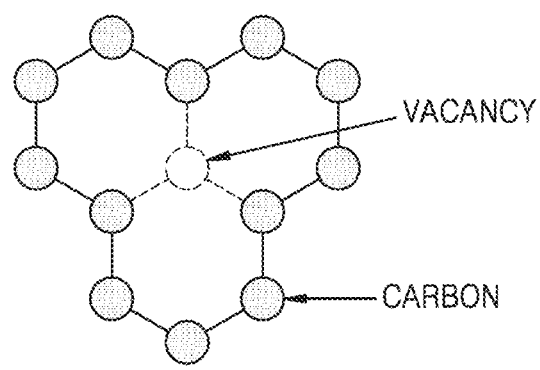

FIG. 3E illustrates a case where a carbon vacancy is generated in a 2D carbon structure having an aromatic ring structure. It can be said that FIGS. 3A to 3D illustrate a case where a functional group (or a substituent) or other atoms (atoms except for carbon) are bonded to the sp3 carbon, and FIG. 3E illustrates a case where a carbon vacancy is generated without a functional group (or a substituent).

Various types of defects described with reference to FIGS. 3A to 3E may be applied to the crystal grain illustrated in FIG. 2. In other words, various types of defects may be included in the nanocrystalline graphene constituting the pellicle membrane M10 of FIG. 1. However, such defects described with reference to FIGS. 3A to 3E are merely examples and other types of defects may also be present. For example, the defects may include a nitrogen (N) atom. In this case, the nitrogen atom may be bonded to the sp3 carbon in the form of $NH_2$. In other words, in FIG. 3A, $NH_2$ instead of OH may be bonded to the sp3 carbon. At least two of the nitrogen atom and the various types of defects described with reference to FIGS. 3A to 3E may be included in one nanocrystalline graphene or one crystal grain. Also, defects other than the above-described defects may be present.

Defects of the nanocrystalline graphene may include at least one selected from an sp3 carbon atom, an oxygen atom, a nitrogen atom, and a carbon vacancy. Herein, the oxygen atom may be the oxygen atom included in OH of FIG. 3A, the oxygen atom of FIG. 3B, or the oxygen atom included in COOH of FIG. 3D, or may also be present in various forms. The nitrogen atom may be included in the form of, for example, $NH_2$, or may also be included in various forms. Also, the hydrogen (H) atoms included OH of FIG. 3A, H of FIG. 3C, and COOH of FIG. 3D may be regarded as defects. An amount (content) of hydrogen (H) in the nanocrystalline graphene may be larger than that in general graphene (for example, monocrystalline graphene). In a case where sheet-type monocrystalline graphene has defects at an edge portion thereof (however, the graphene may not have defects at the edge portion thereof), a very small amount of hydrogen (H) may be present only at the edge portion. An amount of hydrogen (H) in the nanocrystalline graphene may be larger than that in the monocrystalline graphene. However, an amount of hydrogen (H) in the nanocrystalline graphene may be smaller than that in an amorphous carbon layer (ACL). An amount of hydrogen (H) in the ACL may be about 23.6 at %, and an amount of hydrogen (H) in the nanocrystalline graphene may be smaller than about 23.6 at %.

An amount (content) of oxygen (O) in the nanocrystalline graphene described with reference to FIGS. 1 to 3E may be in a range of about 1 at % to about 40 at %. For example, an amount of oxygen (O) in the nanocrystalline graphene may be in a range of about 1 at % to about 20 at %, or about 1 at % to about 10 at %. An amount (content) of hydrogen (H) in the nanocrystalline graphene may be in a range of about 1 at % to about 25 at %. For example, an amount of hydrogen (H) in the nanocrystalline graphene may be in a range of about 1 at % to about 20 at %. In a case where the nanocrystalline graphene includes nitrogen (N), an amount (content) of nitrogen (N) in the nanocrystalline graphene may be in a range of about 1 at % to about 30 at %. For example, an amount of nitrogen (N) in the nanocrystalline graphene may be in a range of about 1 at % to about 20 at %. However, the nanocrystalline graphene may contain about 1 at % or less of nitrogen (N) or may not contain nitrogen (N).

On the other hand, in a Raman spectrum of the nanocrystalline graphene, an intensity ratio of D peak to G peak, e.g., a D/G intensity ratio, may be about 0.5 or more. The G peak is a peak appearing at about 1,580 cm$^{-1}$. The G peak may be caused in a vibration mode corresponding to stretching of a carbon-carbon bond and provide information capable of determining the inclusion or non-inclusion of an aromatic ring structure. The D peak is a peak appearing in a range of about 1,340 cm$^{-1}$ to about 1,350 cm$^{-1}$. The D peak may be generated by defects such as an sp3 carbon and a carbon vacancy. In the Raman spectrum of the nanocrystalline graphene, the D/G intensity ratio may be about 0.5 or more. The D/G intensity ratio may be about 1 or more. The D/G intensity ratio may be about 2 or less.

In the Raman spectrum of the nanocrystalline graphene, an intensity ratio of 2D peak to G peak, e.g., a 2D/G intensity ratio, may be about 0.05 or more. The 2D peak is a peak appearing at about 2,700 cm$^{-1}$ and provides information capable of determining an amount of an aromatic ring structure. The 2D/G intensity ratio may be about 0.05 or more. For example, the 2D/G intensity ratio may be about 0.1 or more. The 2D/G intensity ratio may be about 1 or less. However, in some cases, the 2D/G intensity ratio may be greater than about 1. Conditions related to the Raman spectrum of the nanocrystalline graphene according to some example embodiments will be described below with reference to FIG. 12 and the like.

Figure 4:
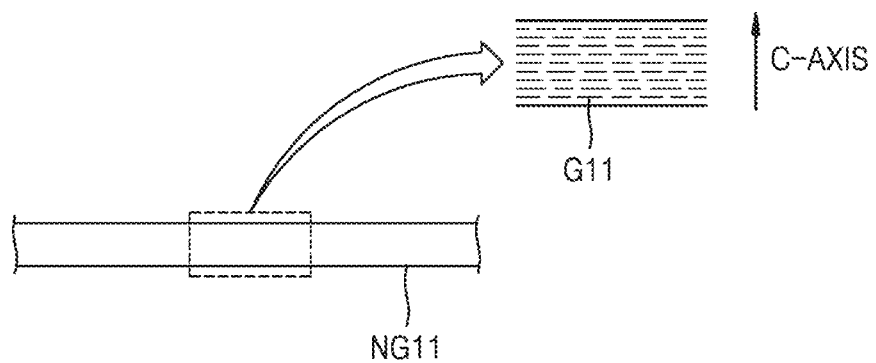
FIG. 4 is a cross-sectional view for describing a layer structure of nanocrystalline graphene applicable to a pellicle for a photomask, according to some example embodiments of inventive concepts.

FIG. 4 is a cross-sectional view for describing a layered structure of nanocrystalline graphene NG11 applicable to a pellicle for a photomask, according to some example embodiments of inventive concepts.

Referring to FIG. 4, the nanocrystalline graphene NG11 applicable to the pellicle may include a plurality of crystal grains G11. A size (length/diameter) of each of the crystal grains G11 may be several hundreds of nm or less (e.g., about 300 nm or less), for example, about 100 nm or less. The crystal grains G11 may be roughly arranged (aligned) in a direction parallel to the nanocrystalline graphene NG11. The nanocrystalline graphene NG11 may have an irregular lattice structure in a vertical direction, that is, a C-axis direction. In other words, the crystal grains G11 may not have a regular or ordered lattice structure, such as graphite, in the C-axis direction.

However, the crystal grains G11 may have a regular (or relatively regular) lattice structure in the C-axis direction in some regions of the nanocrystalline graphene NG11. Even in this case, the crystal grains G11 may have an irregular lattice structure in the C-axis direction in another region of the nanocrystalline graphene NG11. Therefore, when taking into account the entire regions, the nanocrystalline graphene NG11 may be said to have an irregular lattice structure in the C-axis direction.

An interlayer spacing, e.g., a d-spacing of the nanocrystalline graphene NG11 may be greater than a d-spacing of graphite. In other words, the d-spacing of the nanocrystalline graphene NG11 may be greater than about 3.35 Å. For example, the d-spacing of the nanocrystalline graphene NG11 may be about 3.4 Å or more. The d-spacing may be obtained by X-ray diffraction analysis. The nanocrystalline graphene NG11 may have an increased d-spacing since the nanocrystalline graphene NG11 has a nanocrystalline structure and includes defects.

Figure 5:
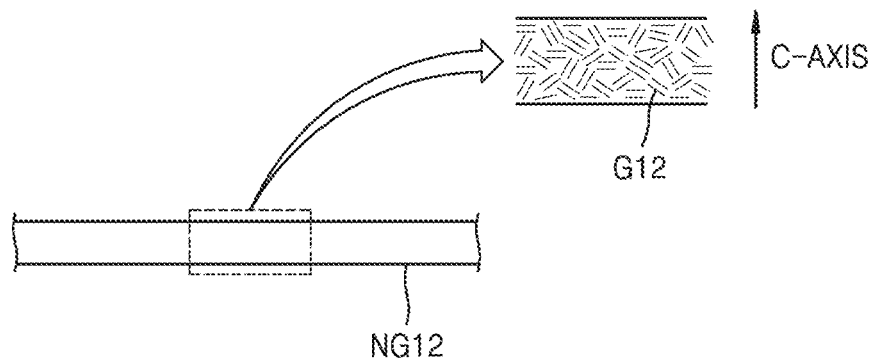
FIG. 5 is a cross-sectional view for describing a layer structure of nanocrystalline graphene applicable to a pellicle for a photomask, according to some example embodiments of inventive concepts.

FIG. 5 is a cross-sectional view for describing a layer structure of nanocrystalline graphene NG12 applicable to a pellicle for a photomask, according to some example embodiments of inventive concepts.

Referring to FIG. 5, the nanocrystalline graphene NG12 applicable to the pellicle may include a plurality of crystal grains G12. A size (length/diameter) of each of the crystal grains G12 may be several hundreds of nm or less (e.g., about 300 nm or less), for example, about 100 nm or less. The crystal grains G12 may be arranged in a random direction or a relatively random direction. Therefore, the nanocrystalline graphene NG12 may have an irregular lattice structure in a C-axis direction. However, the crystal grains G12 may have a regular (or relatively regular) lattice structure in the C-axis direction in some regions (fine regions) of the nanocrystalline graphene NG12. A d-spacing of the nanocrystalline graphene NG12, as obtained through X-ray diffraction analysis, may be greater than about 3.35 Å. For example, the d-spacing of the nanocrystalline graphene NG12 may be about 3.4 Å or more.

A density of the nanocrystalline graphenes NG11 and NG12 may be less than a density of graphite. For example, the density of the nanocrystalline graphenes NG11 and NG12 may be less than about 2.2 g/cm$^3$. The density of the nanocrystalline graphenes NG11 and NG12 may be less than about 2.15 g/cm$^3$. In some cases, the density of the nanocrystalline graphenes NG11 and NG12 may be less than about 2.0 g/cm$^3$. The density of the nanocrystalline graphenes NG11 and NG12 may be greater than a density of an amorphous carbon layer (ACL). In this regard, the density of the nanocrystalline graphenes NG11 and NG12 may be greater than about 1.5 g/cm$^3$. Thus, the density of the nanocrystalline graphenes NG11 and NG12 may be greater than about 1.5 g/cm$^3$ and less than about 2.2 g/cm$^3$.

The layered structures of the nanocrystalline graphenes NG11 and NG12 described with reference to FIGS. 4 and 5 are merely examples and may be variously changed. The structures of FIGS. 4 and 5 may be mixed. Also, one of a lower layer region and an upper layer region of one nanocrystalline graphene may have the structure of FIG. 4, and the other may have the structure of FIG. 5. Other various structures may be applied to the nanocrystalline graphenes NG11 and NG12.

FIG. 6 is a cross-sectional view for describing a structure of a graphene layer GL1 according to a comparative example.

Referring to FIG. 6, the graphene layer GL1 may be formed on a catalyst metal layer CT1. The catalyst metal layer CT1 may be a metal layer having high carbon solubility and may include Ni, Cu, and Pt. The graphene layer GL1 may be formed on the catalyst metal layer CT1 at about 1,000° C. or more by using high-temperature growth technology. However, since the catalyst metal layer CT1 has a polycrystal structure, it may be difficult to control the thickness of the graphene layer GL1 that is formed above the catalyst metal layer CT1. Thus, it may be difficult to secure thickness uniformity of the graphene layer GL1. For example, a thickness of a first region of the graphene layer GL1 formed in a catalyst metal layer region having a first crystal plane (e.g., Ni(111)) and a thickness of a second region of the graphene layer GL1 formed in a catalyst metal layer region having a second crystal plane (e.g., Ni(101)) may have a deviation of several tens of nm or more. This may be caused by a difference in carbon diffusion rates according to a crystal plane of a metal. Therefore, the graphene layer GL1 formed by using the method according to the comparative example may have a large thickness deviation according to a region, and surface roughness thereof may be several tens of nm or more.

The pellicle membrane used in the lithography process needs to have excellent uniformity so as to perform a uniform lithography process. However, in the case of using the method of FIG. 6 according to the comparative example, it may be difficult to secure uniformity (thickness uniformity or the like) of the graphene layer GL1. Thus, the graphene layer GL1 may be unsuitable as a material of the pellicle membrane. In addition, in the comparative example illustrated in FIG. 6, wrinkles or the like may be generated in the graphene layer GL1 due to a difference in a thermal expansion coefficient between the catalyst metal layer CT1 and the graphene layer GL1. Consequently, it may be more difficult to secure uniformity of the graphene layer GL1.

FIGS. 7A and 7B are cross-section images showing a thickness deviation of a graphene layer formed on different regions of a catalyst metal layer, according to a comparative example.

FIG. 7A illustrates a case where a thickness of a graphene layer formed on a first crystal plane of a catalyst metal layer is about 20 nm, and FIG. 7B illustrates a case where a thickness of a graphene layer formed on a second crystal plane of a catalyst metal layer is about 150 nm. The graphene layer of FIG. 7A and the graphene layer of FIG. 7B were formed under the same condition.

Figure 8:
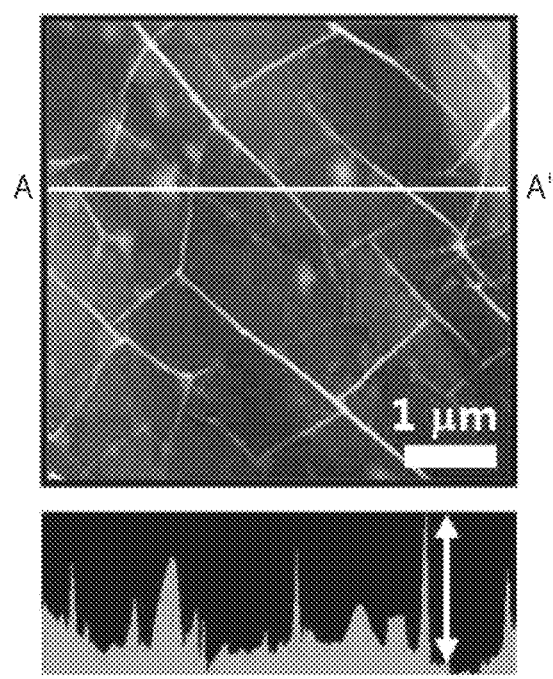
FIG. 8 is an image showing a surface state of a graphene layer formed on a catalyst metal layer, according to a comparative example.

FIG. 8 is an image showing a surface state of a graphene layer formed above a catalyst metal layer, according to a comparative example. A result of surface profile measurement along a line A-A' of the graphene layer is shown under the image of FIG. 8.

Referring to FIG. 8, wrinkles are formed in the graphene layer. This may be caused by a difference in a thermal expansion coefficient between a metal layer and the graphene layer. From the result of surface profile measurement along the line A-A', it can be seen that a thickness deviation of the graphene layer is great.

Figure 9:
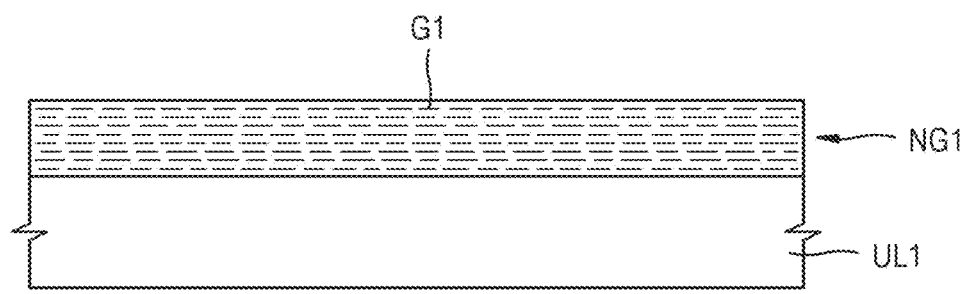
FIG. 9 is a cross-sectional view for describing nanocrystalline graphene applicable to a pellicle for a photomask, according to some example embodiments of inventive concepts.

FIG. 9 is a cross-sectional view for describing nanocrystalline graphene NG1 applicable to a pellicle for a photomask, according to some example embodiments of inventive concepts.

Referring to FIG. 9, the nanocrystalline graphene NG11 may be disposed above a certain underlayer UL1. The nanocrystalline graphene NG1 may include a plurality of crystal grains G1. The crystal grains G1 may be nanoscale. Each of the crystal grains G1 may include a 2D carbon structure having an aromatic ring structure. Also, the nanocrystalline graphene NG1 may include defects. The defects may include at least one selected from an sp3 carbon (C) atom, an oxygen (O) atom, a nitrogen (N) atom, and a carbon vacancy. The material composition and characteristics of the nanocrystalline graphene NG1 may be substantially the same as described with reference to FIGS. 1 to 5. In FIG. 9, the nanocrystalline graphene NG1 is illustrated as having a fine structure similar to that of FIG. 4, but may have a fine structure similar to that of FIG. 5.

Hereinafter, a method of forming the nanocrystalline graphene NG1 of FIG. 9 will be described in more detail. The nanocrystalline graphene NG1 may be formed by using various methods. For example, the nanocrystalline graphene NG1 may be formed by using a deposition process, such as chemical vapor deposition (CVD) or a solution process using a graphene-containing solution.

The method of forming the nanocrystalline graphene NG1 by using the deposition process will be described in detail.

The nanocrystalline graphene NG1 may be formed by using the deposition process such as CVD. The CVD may be thermal CVD or plasma CVD. Examples of the plasma CVD may include inductively coupled plasma CVD (ICP-CVD) and plasma enhanced CVD (PE-CVD). The CVD may use a gas source or a solid source (for example, a source of carbon). The solid source may include polymer, organic monomer, or the like. In the deposition process, various materials may be used for a substrate, e.g., an underlayer UL1. For example, the underlayer UL1 may include a metal or at least one selected from Si, Ge, SiC, $SiO_x$, $Si_xN_y$, and a metal oxide. The underlayer UL1 may include materials of protective layers PL10, PL11, PL20, and PL22 described below with reference to FIGS. 18 to 20. When the underlayer UL1 is a metal, the metal may be a material having a lower carbon solubility than that of the catalyst metal layer CT1 of FIG. 6. In some cases, the material of the catalyst metal layer CT1 of FIG. 6 may be applied as the material of the underlayer UL1. In this case, the nanocrystalline graphene NG1 of FIG. 9 may be formed by appropriately controlling other conditions, for example, by reducing a process temperature (deposition temperature). The underlayer UL1 may be a semiconductor layer or an insulating layer. The insulating layer may include, for example, $SiO_2$. The specific materials of the underlayer UL1 described above are merely examples, and embodiments of the present disclosure are not limited thereto. As described above, the nanocrystalline graphene NG1 may be formed by using a substrate having a low carbon solubility or a substrate having low crystallinity and appropriately controlling the process temperature or the like. An amount or type of defects included in the nanocrystalline graphene NG1 may be adjusted by controlling formation conditions of the nanocrystalline graphene NG1 or by additionally using defect-causing materials. Unlike amorphous carbon, the nanocrystalline graphene NG1 has crystallinity. However, the crystallinity of the nanocrystalline graphene NG1 may be lower than that of graphite or monocrystalline graphene. Also, various characteristics may be exhibited by defects included in the nanocrystalline graphene NG1. Next, the method of forming the nanocrystalline graphene NG1 by using the solution process will be described in detail.

A graphene-containing solution may be prepared by dissolving graphene particles, each having a size of several tens of nm or less, in a certain solvent. A film may be formed by coating the solution on a certain underlayer UL1. Then, nanocrystalline graphene NG1 may be formed from the film by performing annealing or heat treatment on the film. The graphene particles may be graphene quantum dots (GQDs) or graphene nanoplates. Also, graphene oxide particles may be used instead of the graphene particles or together with the graphene particles. The graphene particles or the graphene oxide particles may be prepared by using a hydrothermal synthesis method. The solvent may include at least one selected from N-methylpyrrolidone (NMP), dimethylformamide (DMF), and $NH_4OH$, but embodiments of the present disclosure are not limited thereto. The process of coating the solvent on the underlayer UL1 may be performed by using various coating methods or film casting methods. The underlayer UL1 may include various materials, for example, a metal, a semiconductor, or an insulator. The annealing or heat treatment may be performed on the film coated on the underlayer UL1 at a temperature lower than about 2,000° C. For example, the annealing or heat treatment may be performed at a temperature of about 1,200° C. or lower, but may be performed at a temperature higher than about 1,200° C. The nanocrystalline graphene NG1 may be formed in the above-described manner. Crystallinity or defects of the nanocrystalline graphene NG1 may be adjusted by controlling the temperature or atmosphere of the annealing or heat treatment. In some cases, defect-causing materials may be additionally used.

The nanocrystalline graphene NG1 formed in the above-described manner may have excellent uniformity. The nanocrystalline graphene NG1 may have excellent thickness uniformity and surface uniformity. For example, the surface roughness of the nanocrystalline graphene NG1 may be greater than 0 nm and less than about 10 nm. The surface roughness of the nanocrystalline graphene NG1 may be about 6 nm or less, or about 3 nm or less. The nanocrystalline graphene NG1 may show uniform light transmittance as a whole. Therefore, when the nanocrystalline graphene NG1 is used in a pellicle membrane for lithography, uniformity and precision of the lithography process may be easily secured.

Also, the nanocrystalline graphene NG1 may have high transmittance with respect to a certain wavelength range of light. For example, the nanocrystalline graphene NG1 may have a transmittance of about 80% or more, or 90% or more, with respect to extreme ultraviolet (EUV) light. The nanocrystalline graphene NG1 may have a transmittance of about 80% or more, or 90% or more, with respect to EUV light in a thickness range of about 5 nm to about 100 nm. The nanocrystalline graphene NG1 may be usefully applied to an EUV lithography apparatus.

Also, the nanocrystalline graphene NG1 may have high thermal conductivity, excellent heat dissipation characteristics, excellent EUV resistance, and excellent mechanical strength (tensile strength). For example, the nanocrystalline graphene NG1 may have an in-plane thermal conductivity of several thousands of W/m·k, a Young's modulus of several hundreds of GPa or more, and a tensile strength of several tens of GPa or more, or about 100 GPa or more. Compared with poly-Si that has an in-plane thermal conductivity of 15 W/m·k to about 35 W/m·k, a Young's modulus of about 170 GPa, and a tensile strength of about 1.5 GPa, the nanocrystalline graphene NG1 may have excellent characteristics as a material of the pellicle membrane in various aspects. Also, the nanocrystalline graphene NG1 may have excellent durability and stability.

When the nanocrystalline graphene NG1 of FIG. 9 is applied to the pellicle membrane M10 of FIG. 1, the nanocrystalline graphene NG1 may have a thickness of about 100 nm or less and greater than 0 nm. In other words, the pellicle membrane M10 including the nanocrystalline graphene NG1 may have a thickness of greater than 0 nm and less than or equal to about 100 nm. For example, the nanocrystalline graphene NG1 may have a thickness of about 50 nm or less. The nanocrystalline graphene NG1 may have a transmittance of about 80% or more, or about 90% or more, with respect to EUV light.

Figure 10:
FIG. 10 is an image showing a cross-section of nanocrystalline graphene according to some example embodiments of inventive concepts.

FIG. 10 is an image showing a cross-section of nanocrystalline graphene according to some example embodiments of inventive concepts. The nanocrystalline graphene of FIG. 10 was formed by using the deposition process (CVD) described above. It can be seen that the nanocrystalline graphene according to the embodiment has excellent thickness uniformity.

Figure 11A:
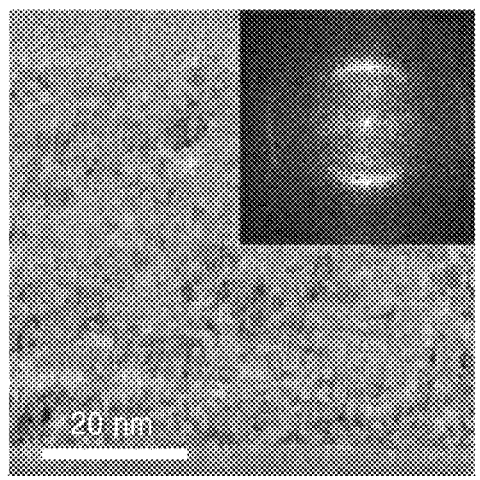
FIG. 11A is an image showing a result of transmission electron microscope (TEM) diffraction analysis of the nanocrystalline graphene of FIG. 10.

FIG. 11A is an image showing a result of transmission electron microscope (TEM) diffraction analysis on the nanocrystalline graphene of FIG. 10.

Figure 11B:
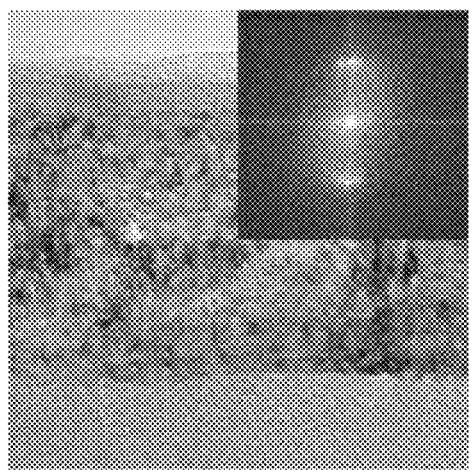
FIG. 11B is an image showing a result of TEM diffraction analysis of nanocrystalline graphene, according to some example embodiments of inventive concepts.
Figure 11C:
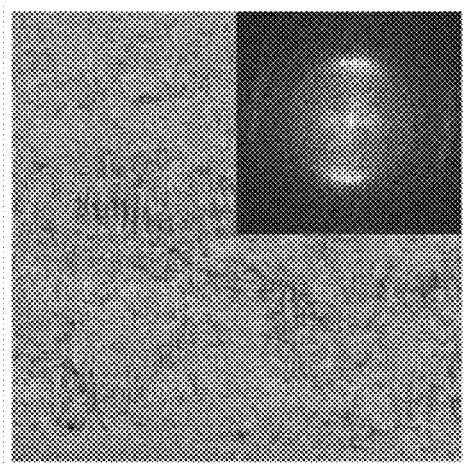
FIG. 11C is an image showing a result of TEM diffraction analysis of nanocrystalline graphene, according to some example embodiments of inventive concepts.

FIGS. 11B and 11C are images showing a result of TEM diffraction analysis on nanocrystalline graphene, according to some example embodiments. The nanocrystalline graphene of FIG. 11B was formed by using the deposition process at a process temperature of 560° C., and the nanocrystalline graphene of FIG. 11C was formed by using the deposition process at a process temperature of 625° C.

Figure 12:
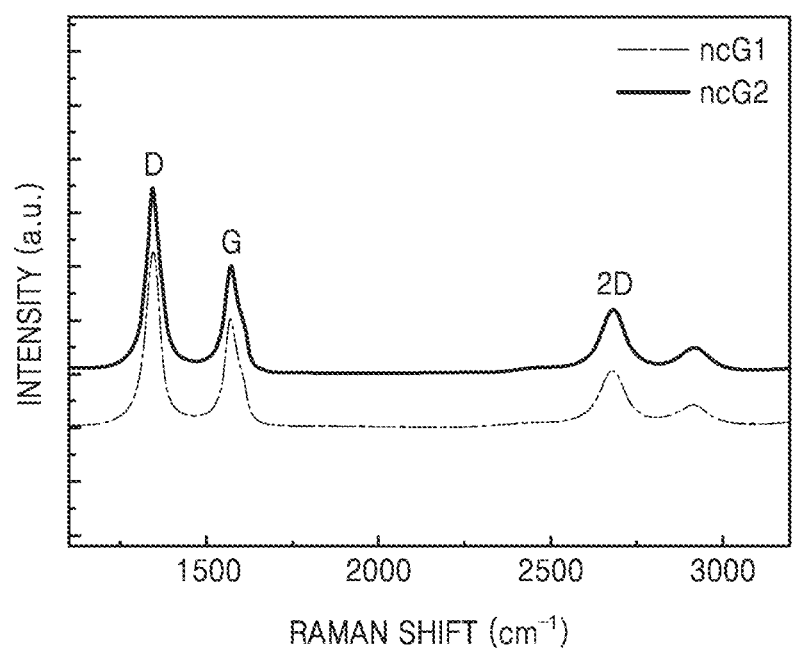
FIG. 12 is a graph showing a result of Raman spectroscopy analysis of nanocrystalline graphene, according to some example embodiments.

FIG. 12 is a graph showing a result of Raman spectroscopy analysis on nanocrystalline graphene, according to some example embodiments. In FIG. 12, nanocrystalline graphene ncG1 and nanocrystalline graphene ncG2 were formed by a deposition process. The nanocrystalline graphene ncG1 differs from the nanocrystalline graphene ncG2 in terms of a process temperature. The nanocrystalline graphene ncG1 was formed at a process temperature of 560° C., and the nanocrystalline graphene ncG2 was formed at a process temperature of 590° C.

Referring to FIG. 12, it can be seen that G peak, D peak, and 2D peak appear in a Raman spectrum. A D/G intensity ratio may be about 0.5 or more. The D/G intensity ratio may be about 1 or more. The D/G intensity ratio may be about 2 or less. A 2D/G intensity ratio may be about 0.05 or more. For example, the 2D/G intensity ratio may be about 0.1 or more. The 2D/G intensity ratio may be about 1 or less.

Figure 13:
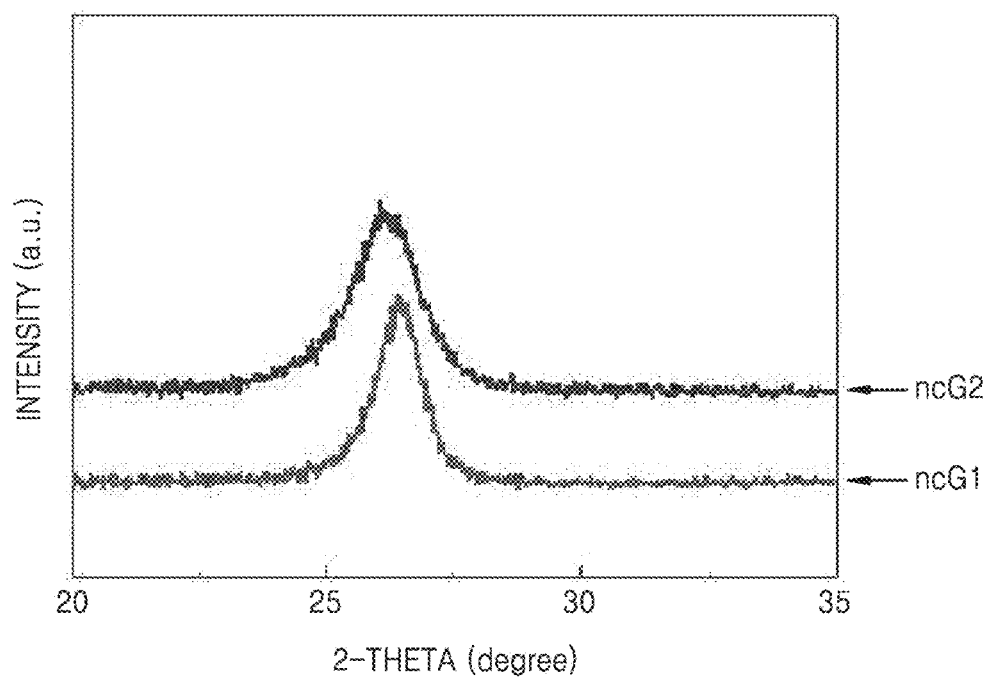
FIG. 13 is a graph showing a result of X-ray diffraction analysis of nanocrystalline graphene, according to some example embodiments.

FIG. 13 is a graph showing a result of X-ray diffraction analysis on nanocrystalline graphene, according to some example embodiments. In the graph of FIG. 13, 2θ at which the peak appears may be obtained. By using this information, an interlayer spacing (e.g., d-spacing ($d_{002}$)) of the nanocrystalline graphene may be calculated.

Figure 14:
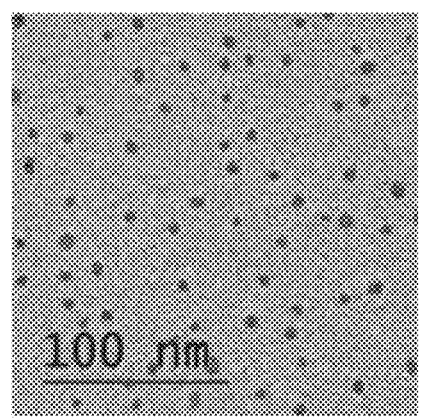
FIG. 14 is a scanning electron microscope (SEM) image showing graphene particles that can be used to form nanocrystalline graphene, according to some example embodiments of inventive concepts.

FIG. 14 is a scanning electron microscope (SEM) image showing graphene particles that can be used to form nanocrystalline graphene, according to some example embodiments of inventive concepts. Specifically, FIG. 14 shows graphene particles that may be used for forming nanocrystalline graphene through the solution process described above. The graphene particles may be GQDs.

Figure 15:
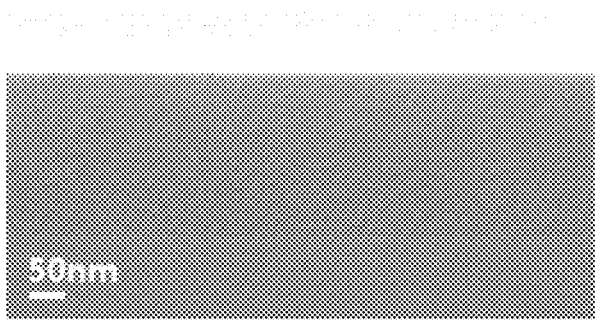
FIG. 15 is an image showing a cross-section of nanocrystalline graphene formed through a solution process by using the graphene particles of FIG. 14.

FIG. 15 is an image showing a cross-section of nanocrystalline graphene formed through a solution process by using graphene particles of FIG. 14. It can be seen that the nanocrystalline graphene according to the embodiment has excellent thickness uniformity.

Figure 16A:
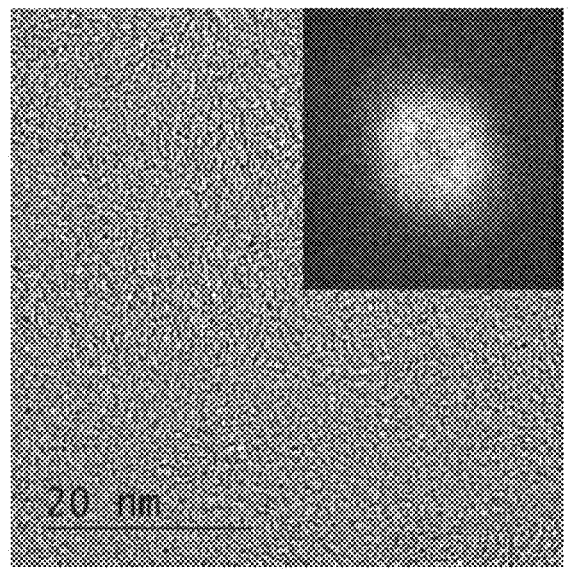
FIG. 16A is an image showing a result of TEM diffraction analysis of the nanocrystalline graphene of FIG. 15.

FIG. 16A is an image showing a result of TEM diffraction analysis on the nanocrystalline graphene of FIG. 15. An annealing temperature when forming the nanocrystalline graphene of FIG. 16A was 600° C.

Figure 16B:
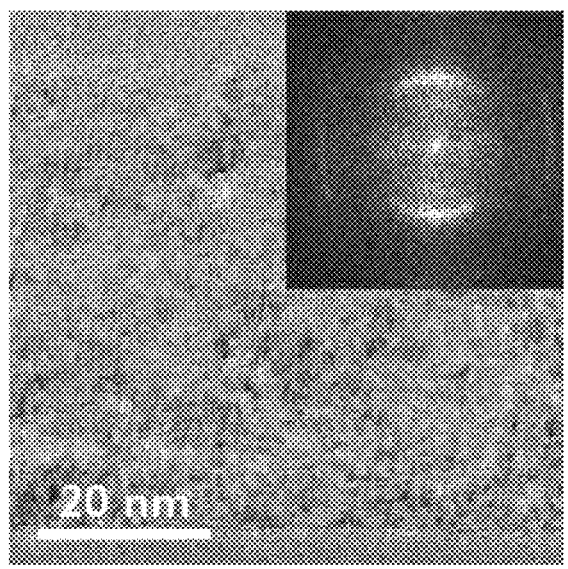
FIG. 16B is an image showing a result of TEM diffraction analysis of nanocrystalline graphene, according to some example embodiments of inventive concepts.

FIG. 16B is an image showing a result of TEM diffraction analysis on nanocrystalline graphene, according to some example embodiments of inventive concepts. The nanocrystalline graphene of FIG. 16B was formed through a solution process at an annealing temperature of 1,000° C.

Figure 17:
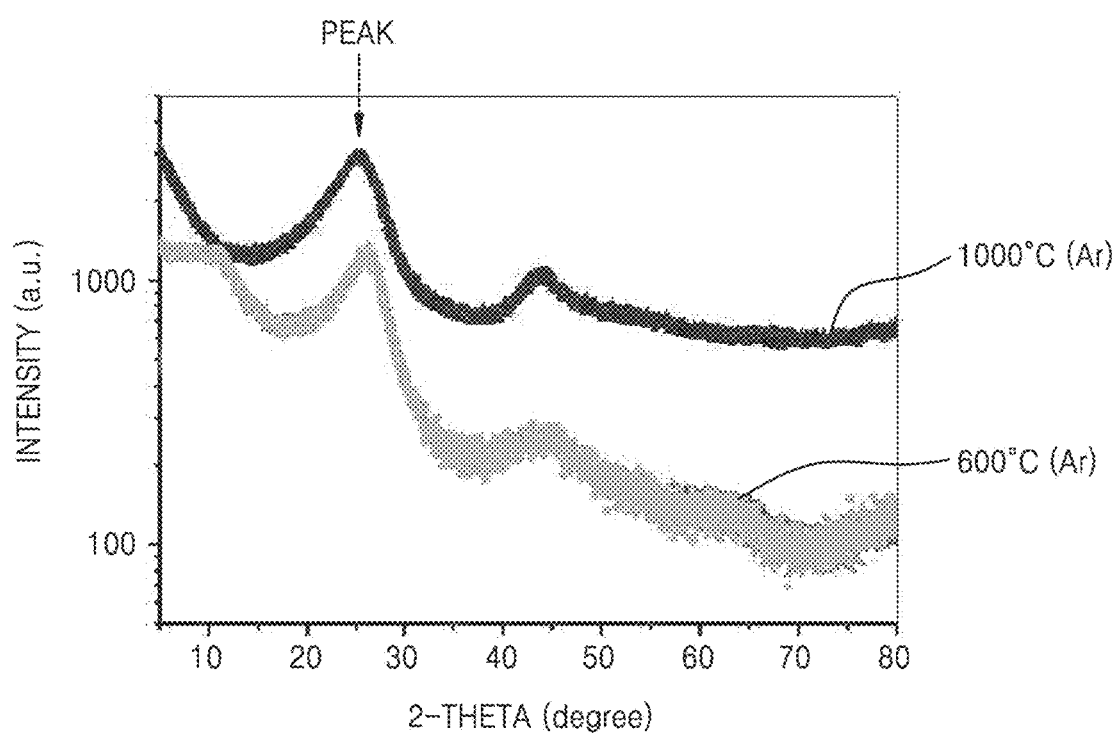
FIG. 17 is an image showing a result of X-ray diffraction analysis of nanocrystalline graphene, according to some example embodiments.

FIG. 17 is a graph showing a result of X-ray diffraction analysis on nanocrystalline graphenes, according to some example embodiments. The nanocrystalline graphenes of FIG. 17 were formed through a solution process at an annealing or heat treatment temperature of 600° C. (Ar) and 1000° C. (Ar). 600° C. (Ar) represents a case where heat treatment was performed at 600° C. in an argon (Ar) atmosphere, and 1000° C. (Ar) represents a case where heat treatment was performed at 1,000° C. in an Ar atmosphere. In the graph of FIG. 17, 2θ or the like at which the peak appears may be obtained. By using this information, an interlayer spacing (e.g., d-spacing ($d_{002}$)) of the nanocrystalline graphene may be calculated.

Table 1 below shows various physical properties of the nanocrystalline graphenes according to some example embodiments. For comparison with the nanocrystalline graphene, Table 1 also shows physical properties of graphite, graphene formed on poly-Ni, and an amorphous carbon layer (ACL). The nanocrystalline graphenes according to the embodiments include nanocrystalline graphene ncG formed by using a deposition process and nanocrystalline graphene ncG formed by using a solution process.

TABLE 1

| Sample (structure) | Orientation (TEM) | Raman D/G | Raman 2D/G | Contents (at %) C | O | H | g/cm³ | XRD 2θ | d$_{002}$ |
|---|---|---|---|---|---|---|---|---|---|
| Graphite (aromatic sp2) | hexagonal/ rhombohedral | ~0 | >0.5 | ~99.9 | <0.1 | | 2.2 | 26.55° | 3.35 Å |
| Graphene on poly-Ni (aromatic sp2) | turbostratics | <0.1 | >0.5 | ~99.5 | <0.5 | | | 26.1° | |
| nc-G1 deposition 560° C. (aromatic sp2 + sp3) | random/ turbostratics | >0.5 | ~0.5 | 91.4 | 3.0 | 5.6 | 1.8 | <26° | >3.4 Å |
| nc-G2 deposition 625° C. (aromatic sp2 + sp3) | random/ turbostratics | >0.5 | ~0.5 | 93.0 | 1.0 | 6.0 | 2.05 | <26° | >3.4 Å |
| nc-G3 solution 600° C. (aromatic sp2 + sp3) | random/ turbostratics | >0.5 | ~0.1 | 85.8 | 2.4 | 11.8 | 1.62 | <26° | >3.4 Å |
| nc-G4 solution 1000° C. (aromatic sp2 + sp3) | random/ turbostratics | >0.5 | ~0.1 | 89.5 | 3.0 | 7.5 | 1.70 | <26° | >3.4 Å |
| ACL (linear sp2 + sp3) | | | | 72.4 | 4.0 | 23.6 | 1.50 | | |

As shown in Table 1, the nanocrystalline graphenes ncG may have different structures and different characteristics from those of graphite, graphene on poly-Ni, and the ACL. However, data of Table 1 is merely an example, and physical properties of the nanocrystalline graphenes may be changed according to formation conditions.

Figure 19:
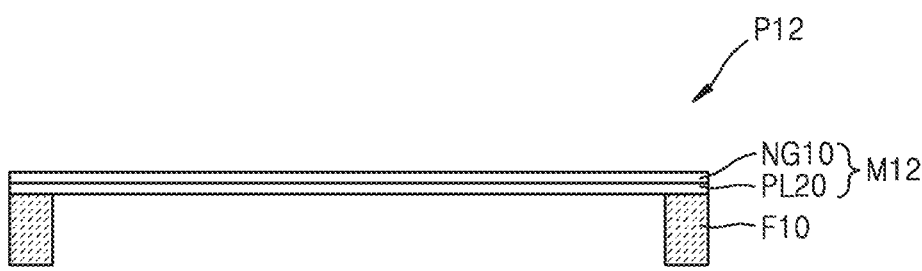
FIG. 19 is a cross-sectional view of a pellicle for a photomask, according to some example embodiments of inventive concepts.
Figure 20:
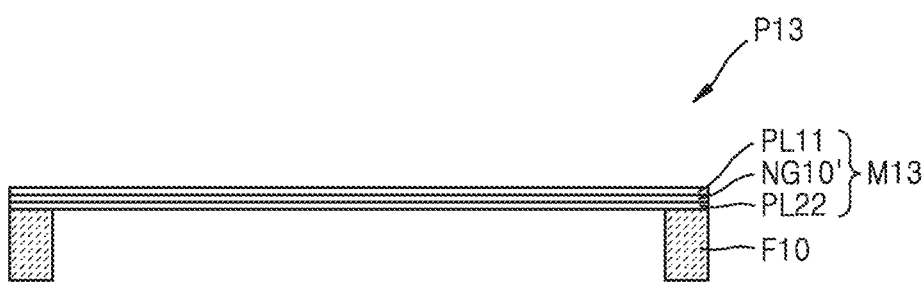
FIG. 20 is a cross-sectional view of a pellicle for a photomask, according to some example embodiments of inventive concepts.

According to some example embodiments of inventive concepts, the pellicle P10 of FIG. 1 may further include a protective layer on at least one surface of the pellicle membrane M10. In other words, the pellicle P10 may further include a certain protective layer on at least one of an upper surface and a lower surface of the pellicle membrane M10. Examples of the pellicle P10 are illustrated in FIGS. 18 to 20.

Figure 18:
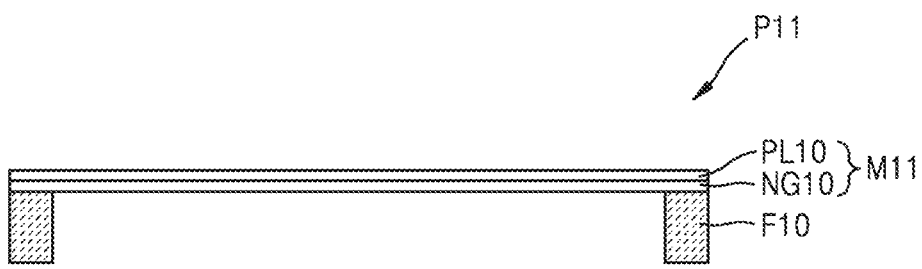
FIG. 18 is a cross-sectional view of a pellicle for a photomask, according to some example embodiments of inventive concepts.

FIG. 18 is a cross-sectional view of a pellicle P11 for a photomask, according to some example embodiments of inventive concepts.

Referring to FIG. 18, the pellicle P11 may include a first material layer NG10 including nanocrystalline graphene, and a protective layer PL10 on a surface (upper surface) of the first material layer NG10. The first material layer NG10 and the protective layer PL10 may constitute one pellicle membrane M11. The first material layer NG10 may include nanocrystalline graphene described with reference to FIGS. 1 to 5 and 9 to 17. Accordingly, the material and characteristics of the first material layer NG10 may correspond to those of the pellicle membrane M10 of FIG. 1.

The protective layer PL10 may include, for example, at least one selected from a carbon-based material, a metal chalcogenide-based material, a silicon derivative, and a metal oxide. The carbon-based material may include at least one selected from amorphous carbon, graphene, nano-graphite, carbon nanosheet, carbon nanotube, silicon carbide (SiC), and boron carbide (B4C). The metal chalcogenide-based material may include, for example, a transition metal dichalcogenide (TMD). As a specific example, the metal chalcogenide-based material may include one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. When the protective layer PL10 includes the carbon-based material or the metal chalcogenide-based material, excellent uniformity and transmittance may be secured. In particular, the TMD may have a surface roughness of several nanometers or less and may have a high transmittance of 90% or more with respect to EUV light. However, the carbon-based material and the metal chalcogenide-based material, which are applied to the protective layer PL10, are merely examples, and various materials may also be applied to the protective layer PL10. Also, the protective layer PL10 may include other materials except for the carbon-based material or the metal chalcogenide-based material. For example, the protective layer PL10 may include a silicon derivative or a metal oxide. The silicon derivative may include, for example, at least one selected from the group consisting of Si, SiOx, and Si$_x$N$_y$. SiO$_x$ may be SiO$_2$, and Si$_x$N$_y$ may be Si$_3$N$_4$. The metal oxide may include, for example, at least one metal element selected from the group consisting of Hf, Al, Mg, Zr, Cu, Ni, Zn, and Ti, and an oxygen (O) atom. Also, the protective layer PL10 may include a metal, a metallic compound, or a 2D material.

The pellicle P11 may further include a pellicle frame F10 at an edge portion of the pellicle membrane M11. The first material layer NG10 including the nanocrystalline graphene may be disposed between the protective layer PL10 and the pellicle frame F10.

The protective layer PL10 may protect and support the first material layer NG10 including the nanocrystalline graphene. Also, optical characteristics of the pellicle membrane M11 may be adjusted by using the protective layer PL10. Also, the protective layer PL10 may increase mechanical strength of the pellicle membrane M11. Therefore, the pellicle membrane M11 having more excellent characteristics may be realized by using the protective layer PL10.

The pellicle membrane M11 may have a thickness of about 150 nm or less, or about 100 nm or less. The first material layer NG10 may have a thickness of about 100 nm or less, or about 50 nm or less, and the protective layer PL10 may have a thickness of about 100 nm or less, or about 50 nm or less. However, the thickness ranges of the first material layer NG10 and the protective layer PL10 may be changed. The pellicle membrane M11 may have a transmittance of about 80% or more, or 90% or more, with respect to light that is in a certain wavelength range, for example, EUV light.

According to some example embodiments of inventive concepts, a formation position of the protective layer PL10 may be changed. One example thereof is illustrated in FIG. 19.

Referring to FIG. 19, the pellicle P12 may include a first material layer NG10 including nanocrystalline graphene, and a protective layer PL20 on a surface (lower surface) of the first material layer NG10. The first material layer NG10 and the protective layer PL20 may constitute one pellicle membrane M12. The material composition of the protective layer PL20 may be identical to or similar to that of the protective layer PL10 of FIG. 18. The protective layer PL20 may be disposed between the first material layer NG10 and a pellicle frame F10.

According to some example embodiments, the pellicle P12 may include protective layers on both an upper surface and a lower surface of the first material layer NG10. One example thereof is illustrated in FIG. 20.

Referring to FIG. 20, a pellicle P13 may include a first material layer NG10', a first protective layer PL11 on a surface (for example, an upper surface) of the first material layer NG10', and a second protective layer PL22 on another surface (for example, a lower surface) of the first material layer NG10'. The first material layer NG10' and the first and second protective layers PL11 and PL22 may constitute one pellicle membrane M13. The first material layer NG10' may be a layer made of nanocrystalline graphene, or may include nanocrystalline graphene. The first and second protective layers PL11 and PL22 may correspond to or be similar to the protective layers PL10 and PL20 described with reference to FIGS. 18 and 19. The first protective layer PL11 and the second protective layer PL22 may include the same material or different materials.

The pellicle membrane M13 may have a thickness of about 150 nm or less, or about 100 nm or less. The first material layer NG10 may have a thickness of about 100 nm or less, or about 50 nm or less, and each of the first and second protective layers PL11 and PL22 may have a thickness of about 100 nm or less, or about 50 nm or less. The pellicle membrane M13 may have a transmittance of about 80% or more, or 90% or more, with respect to light that is in a certain wavelength range, for example, EUV light.

Figure 21:
FIG. 21 is a cross-sectional view of a pellicle for a photomask, according to some example embodiments of inventive concepts.

FIG. 21 is a cross-sectional view of a pellicle P14 for a photomask, according to some example embodiments of inventive concepts.

Referring to FIG. 21, the pellicle P14 may further include a bonding layer B10 between a pellicle membrane M10 and a pellicle frame F10. The bonding layer B10 may more tightly bond the pellicle membrane M10 to the pellicle frame F10. Various materials used as adhesive or bonding materials in the fields of general semiconductor devices and electronic circuits may be applied as the material of the bonding layer B10. FIG. 21 illustrates a case where the bonding layer B10 is provided in the structure of FIG. 1, but the bonding layer B10 may also be provided in the structures of FIGS. 18 to 20.

Figure 22:
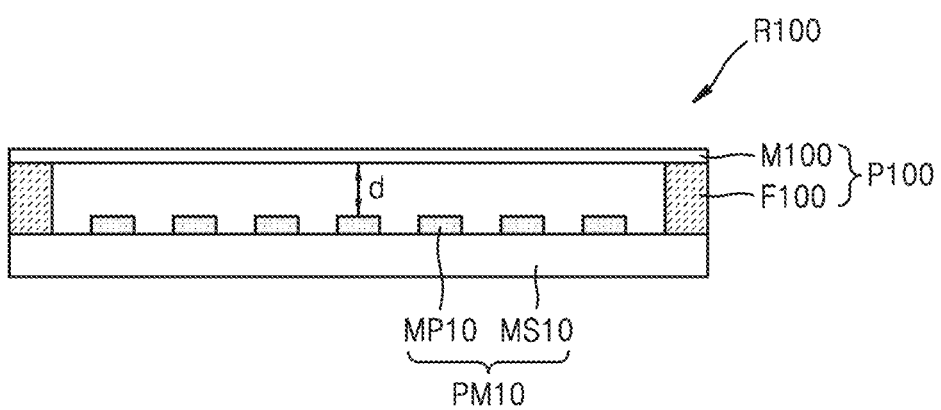
FIG. 22 is a cross-sectional view of a reticle including a pellicle for a photomask, according to some example embodiments of inventive concepts.

FIG. 22 is a cross-sectional view of a reticle R100 including a pellicle P100 for a photomask PM10, according to some example embodiments of inventive concepts.

Referring to FIG. 22, the reticle R100 may include the photomask PM10, and the pellicle P100 configured to protect the photomask PM10. The photomask PM10 may include a mask substrate MS10, and a mask pattern MP10 on the mask substrate MS10. A shape, size, and interval of the mask pattern MP10 are merely examples, and may be variously changed.

The pellicle P100 may include a pellicle membrane M100 spaced apart from the mask pattern MP10. The pellicle membrane M100 may have the same structure as those of the pellicle membranes M10 to M13 described with reference to FIGS. 1 to 5 and 9 to 21. Therefore, the pellicle membrane M100 may include nanocrystalline graphene having defects. Therefore, the pellicle membrane M100 may further include a protective layer on at least one surface of the nanocrystalline graphene. The pellicle membrane M100 may have a first horizontal length of several tens of mm to several hundreds of mm and a second horizontal length (width) of several tens of mm to several hundreds of mm. The pellicle membrane M100 may have a thickness of about 150 nm or less, or about 100 nm or less. For example, the pellicle membrane M100 may have a thickness of about 50 nm or less.

The pellicle P100 may further include a pellicle frame F100 disposed at an edge portion of the mask pattern MP10 to support the pellicle membrane M100. Due to the pellicle frame F100, the photomask PM10 and the pellicle membrane M100 may be spaced apart from each other by a certain internal d. In other words, due to the pellicle frame F100, the mask pattern MP10 of the photomask PM10 and the pellicle membrane M100 may be spaced apart from each other by a certain internal d. The interval d may be about 15 mm or less. For example, the interval d may be about 1 mm to about 10 mm. Although not illustrated, a bonding layer may be further provided between the pellicle membrane M100 and the pellicle frame F100. Also, a bonding layer may be further provided between the pellicle frame F100 and the photomask PM10.

The pellicle P100 may protect the photomask PM10 from external contaminants (for example, dust, resist, or the like). When the pellicle P100 is absent, foreign substances may be attached to the photomask PM10, causing various issues in the lithography process. Details thereof will be described below with reference to FIG. 23.

Figure 23:
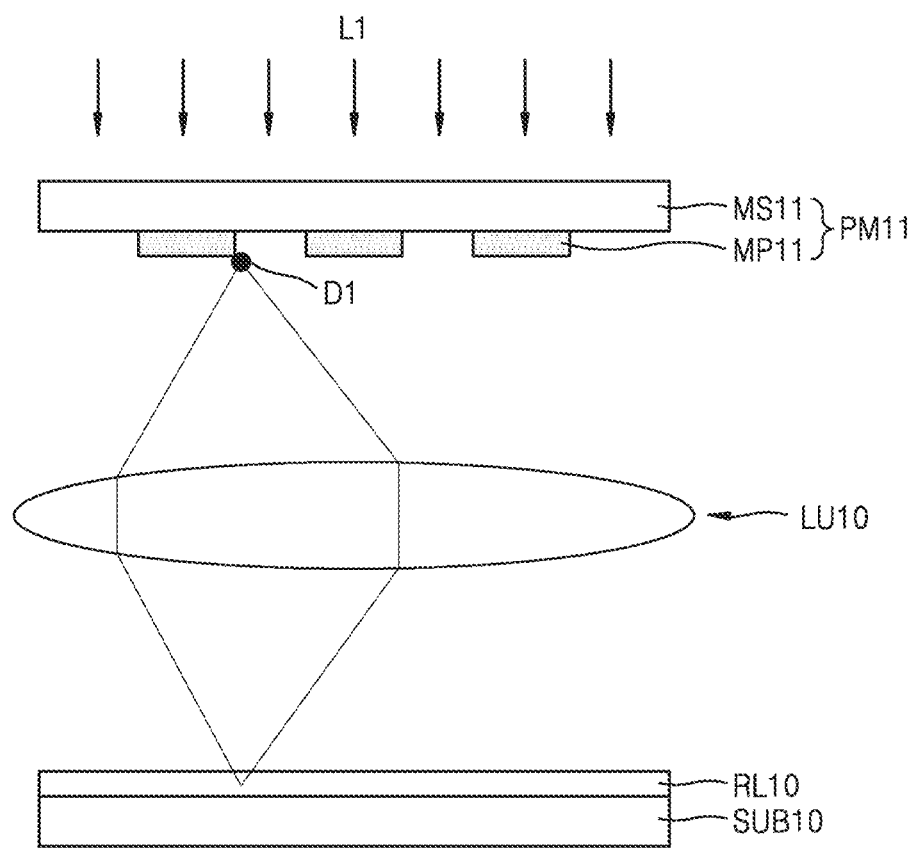
FIG. 23 is a diagram for describing an effect caused by foreign substances when a lithography process is performed by using a photomask without a pellicle.

FIG. 23 is a diagram for describing an effect caused by foreign substances D1 when a lithography process is performed by using a photomask PM11 without a pellicle.

Referring to FIG. 23, when the lithography process is performed by using the photomask PM11 without a pellicle, the foreign substances D1 may be directly attached to the photomask PM11. The photomask PM11 may include a mask substrate MS11 and a mask pattern MP11, and the foreign substances D1 may be directly attached to the mask pattern MP11.

Light L1 generated by a light source (not illustrated) may pass through the photomask PM11 and a lens unit LU10, and a resist layer RL10 of a substrate SUB10 may be exposed to the light L1. Through such an exposure process, a pattern corresponding to the mask pattern MP11 may be transferred onto the resist layer RL10. However, when the foreign substances D1 are directly attached to the mask pattern MP11 or a region of the mask substrate MS11 exposed by the mask pattern MP11, the foreign substances D1 may have a direct influence on patterning of the resist layer RL10. That is, light passing through the foreign substances D1 may be focused on the resist layer RL10. Due to this, an unintended region of the resist layer RL10 may be exposed. Consequently, patterns having a desired (intended) shape may not be realized on the resist layer RL10. In particular, as a width (line width) of a pattern to be formed becomes narrower, the influence of the foreign substances D1 may further increase.

Figure 24:
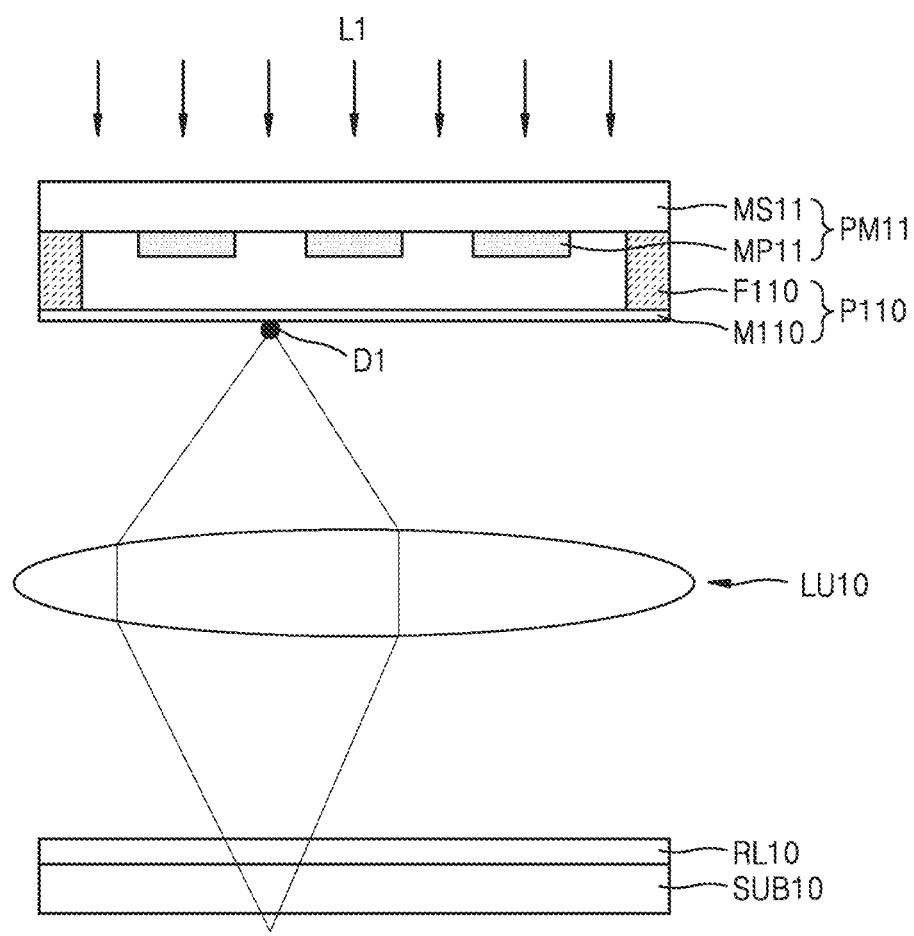
FIG. 24 is a diagram for describing how the influence of foreign substances is removed by a pellicle when a lithography process is performed in a state in which a photomask is protected by the pellicle.

FIG. 24 is a diagram for describing how the influence of foreign substances D1 is removed by a pellicle P110 when a lithography process is performed in a state in which a photomask PM11 is protected by the pellicle P110. Specifically, FIG. 24 illustrates a case where the lithography process is performed in a state in which the photomask PM11 is protected by the pellicle P110. The pellicle P110 may include a pellicle membrane M110 and a pellicle frame F110 and may correspond to the pellicle P100 of FIG. 22.

Referring to FIG. 24, when the pellicle P110 protects the photomask PM11, the foreign substances D1 may be attached to the outside of the pellicle P110. For example, the foreign substances D1 may be attached to the outer surface of the pellicle membrane M110. Thus, the foreign substances D1 may be spaced apart from the mask pattern MP11 by a certain interval. In this case, the foreign substances D1 may have no or almost no influence on patterning of the resist layer RL10. Light passing through the foreign substances D1 may not be focused on the resist layer RL10 and may be focused on a region except for the resist layer RL10. In other words, light passing through the foreign substances D1 may be defocused on the resist layer RL10. Therefore, the foreign substances D1 may have no influence on patterning of the resist layer RL10. As such, when the pellicle P110 is used, the influence of the foreign substances D1 may be removed when the lithography process is performed.

The interval between the photomask PM11 and the pellicle membrane M110 may be determined within an appropriate range. For example, the pellicle membrane M110 may be spaced apart from the photomask PM11 by a certain interval or more. Also, the interval may be determined by taking into account the wavelength band of the light L1 used in the lithography process or other conditions.

In FIGS. 23 and 24, it is assumed that the photomask PM11 is a transmissive photomask. However, even when the photomask PM11 is a reflective photomask, the effects described with reference to FIGS. 23 and 24 may similarly appear. Also, the lens unit LU10 is simply illustrated in FIGS. 23 and 24, but in practice, a lens unit or a lens system having a more complicated configuration may be used.

Hereinafter, a lithography apparatus (e.g., an exposure apparatus for lithography), to which a reticle including a pellicle is applied, according to some example embodiments of inventive concepts will be described with reference to FIGS. 25 to 27.

Figure 25:
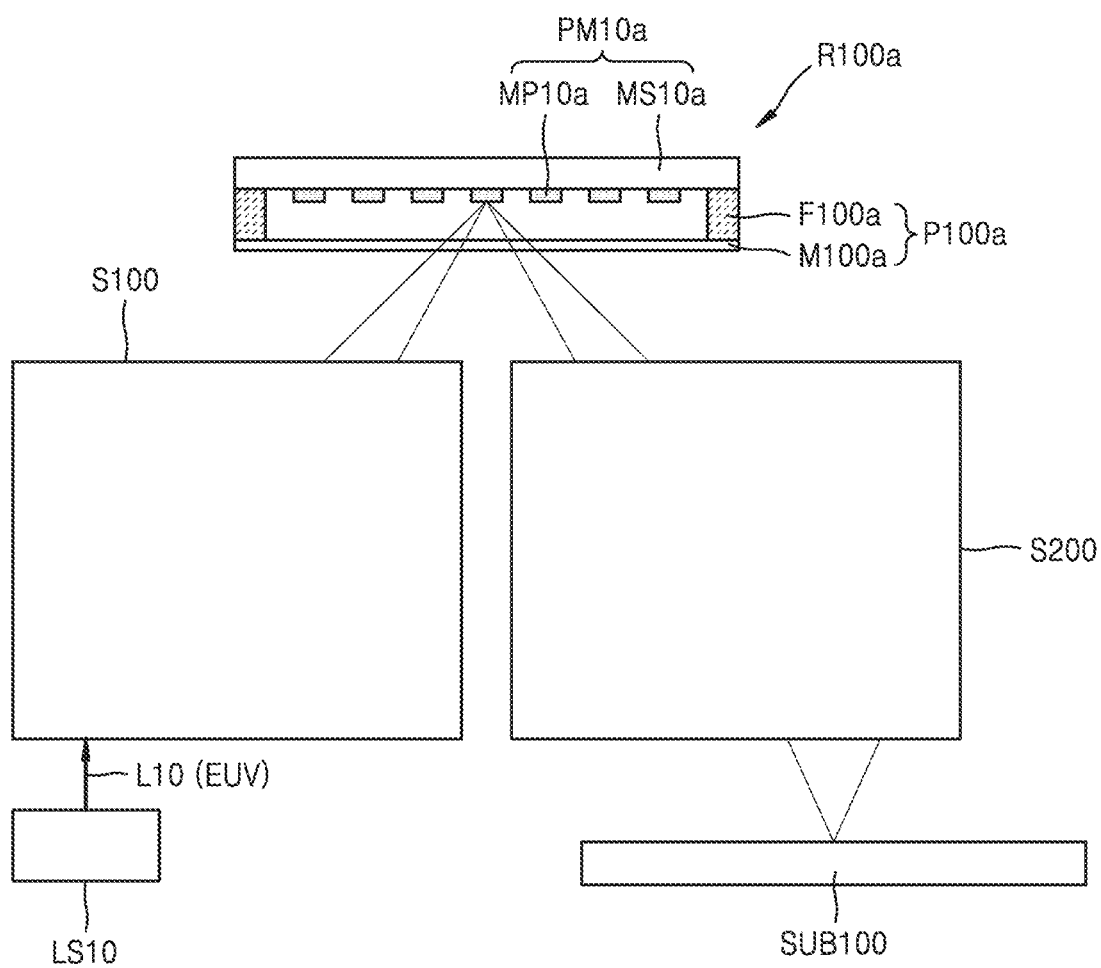
FIG. 25 is a diagram illustrating an exposure apparatus for lithography, to which a reticle including a pellicle is applied, according to some example embodiments of inventive concepts.

FIG. 25 is a diagram illustrating an exposure apparatus for lithography, to which a reticle R100a including a pellicle P100a is applied, according to some example embodiments of inventive concepts.

Referring to FIG. 25, the reticle R100a may be a reflective reticle. The reticle R100a may include a photomask PM10a and the pellicle P100a configured to protect the photomask PM10a. The photomask PM10a may include a mask substrate MS10a and a mask pattern MP10a, and the pellicle P100a may include a pellicle membrane M100a and a pellicle frame F100a. The reticle R100a may correspond to the reticle R100 described with reference to FIG. 22. The mask substrate MS10a may have characteristics that reflect light of a certain wavelength region, and the mask pattern MP10a may have characteristics that absorb the light of the certain wavelength region.

Light L10 generated by a light source LS10 may pass through the reticle R100a and be irradiated onto a substrate SUB100. The light L10 may be EUV light. The EUV light may have a wavelength of about 13.3 nm to about 13.5 nm, or about 13.3 nm or less. The mask substrate MS10a of the reticle R100a may have characteristics that reflect EUV light, and the mask pattern MP10a may have characteristics that absorb EUV light. The light reflected from the reticle R100a may be incident on the substrate SUB100. The substrate SUB100 may include a region (layer) to be patterned. For example, the substrate SUB100 may be a wafer including a certain resist layer (not illustrated). The light reflected from the reticle R100a may be focused on the resist layer (not illustrated) of the substrate SUB100. Consequently, a pattern of the mask pattern MP10a may be transferred onto the substrate SUB100.

At least one optical member may be provided between the light source LS10 and the reticle R100a and/or between the reticle R100a and the substrate SUB100. For example, a first optical system S100 may be provided between the light source LS10 and the reticle R100a, and a second optical system S200 may be provided between the reticle R100a and the substrate SUB100. The first optical system S100 may be an "illumination optical system." For example, the first optical system S100 may include at least one collimating lens and/or an alignment optical system. The light source LS10 may be included in the illumination optical system S100. The second optical system S200 may be a "projection optical system." For example, the second optical system S200 may include at least one reflection member and/or at least one lens. The configurations of the first optical system S100 and the second optical system S200 may be variously changed. In some example embodiments, the lithography process (exposure process) may be performed while moving the reticle R100a in a horizontal direction and/or moving the substrate SUB100 in a horizontal direction.

Figure 26:
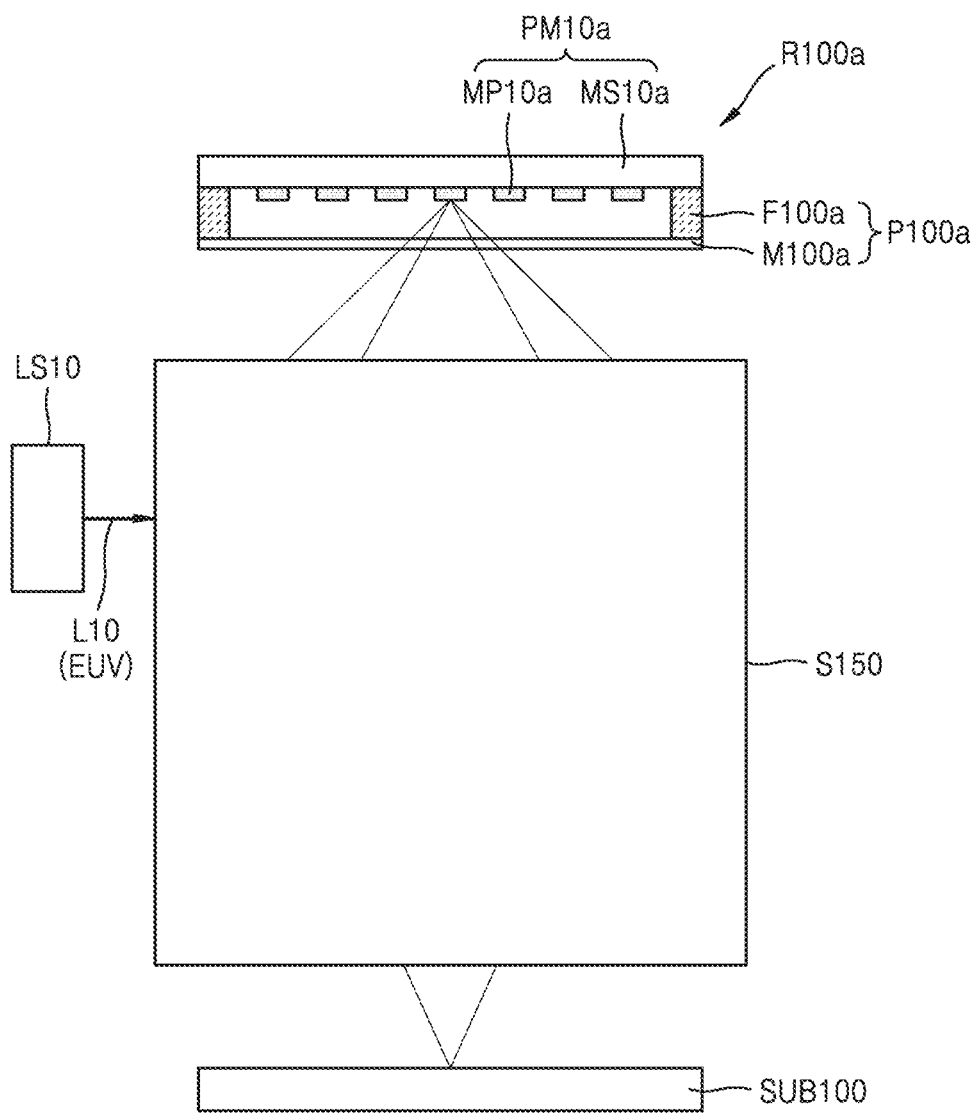
FIG. 26 is a diagram illustrating an exposure apparatus for lithography, to which a reticle including a pellicle is applied, according to some example embodiments of inventive concepts.

FIG. 26 is a diagram illustrating an exposure apparatus for lithography, to which a reticle R100a including a pellicle is applied, according to some example embodiments of inventive concepts. FIG. 26 illustrates another example in which a reflective reticle R100a is used.

Referring to FIG. 26, light L10 generated by a light source LS10 may pass through the reticle R100a and be irradiated onto a substrate SUB100. The reticle R100a may be provided within a traveling path of the light L10. An optical system S150 may be provided between the reticle R100a and the substrate SUB100. After the light L10 generated by the light source LS10 passes through the optical system S150 and is irradiated onto the reticle R100a, the light reflected from the reticle R100a may pass through the optical system S150 again and be then incident on the substrate SUB100. The optical system S150 may have both the function of the first optical system S100 and the function of the second optical system S200. In other words, the optical system S150 may have both the configuration of the illumination optical system and the configuration of the projection optical system. In some example embodiments, the lithography process (exposure process) may be performed while moving the reticle R100a in a horizontal direction and/or moving the substrate SUB100 in a horizontal direction.

Figure 27:
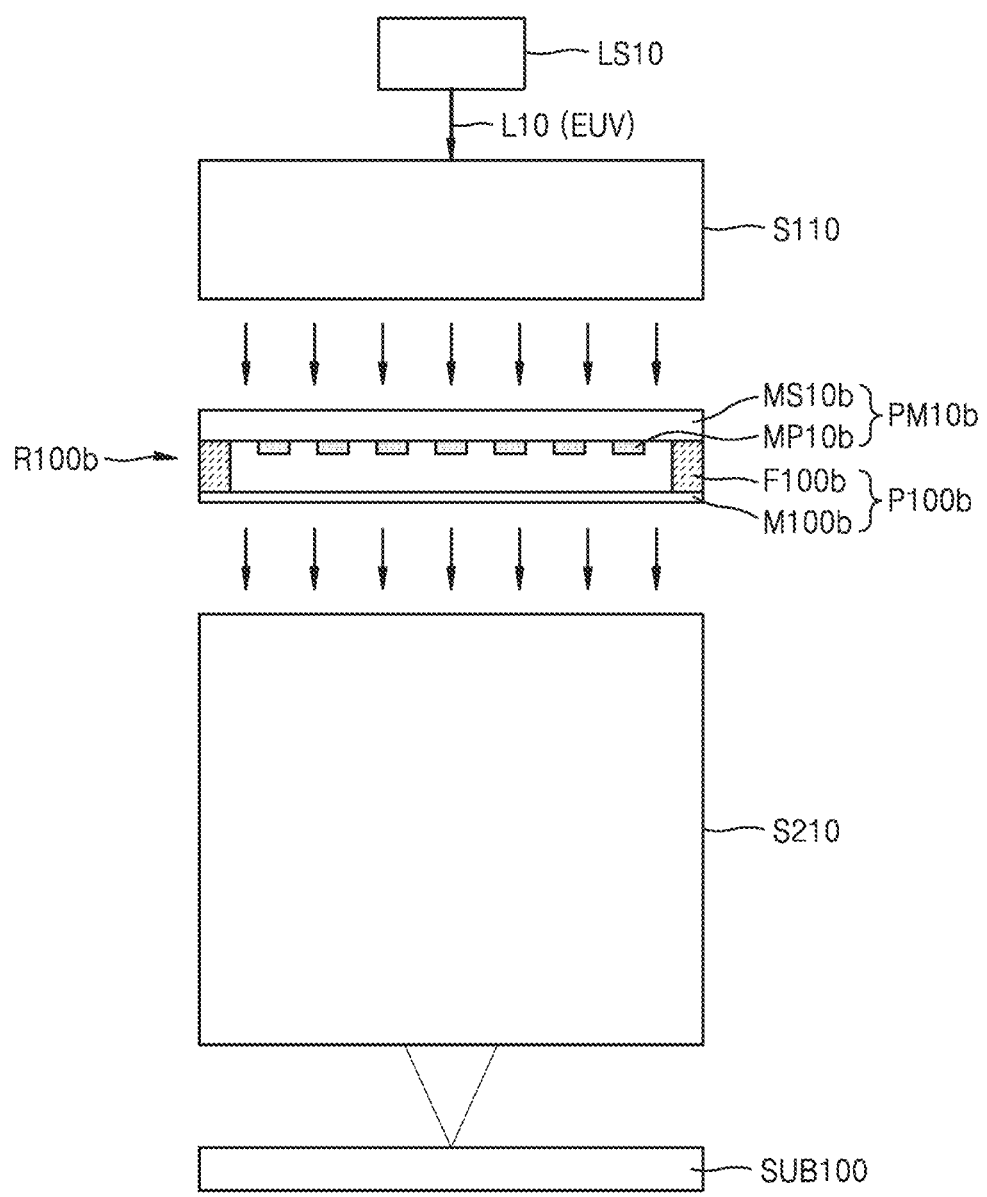
FIG. 27 is a diagram illustrating an exposure apparatus for lithography, to which a reticle including a pellicle is applied, according to some example embodiments of inventive concepts.

FIG. 27 is a diagram illustrating an exposure apparatus for lithography, to which a reticle R100b including a pellicle P100b is applied, according to some example embodiments of inventive concepts. FIG. 26 illustrates an example in which a transmissive reticle R100b is used.

Referring to FIG. 27, the exposure apparatus may include a light source LS10 configured to generate light L10. The light L10 may be EUV light. The reticle R100b may be provided within a traveling path of the light L10. The reticle R100b may be a transmissive reticle R100b. In this case, the reticle R100b may include a transmissive photomask PM10b, and the photomask PM10b may include a mask substrate MS10b and a mask pattern MP10b. The mask substrate MS10b may have characteristics that transmit the light L10, and the mask pattern MP10b may have characteristics that absorb or reflect the light L10. The reticle R100b may include the pellicle P100b configured to protect the photomask PM10b, and the pellicle P100b may include a pellicle membrane M100b and a pellicle frame F100b. The pellicle P100b may have the same structure as those described with reference to FIGS. 1 to 5 and 9 to 21.

The light L10 generated by the light source LS10 may pass through the reticle R100b and be irradiated onto a substrate SUB100. Consequently, an exposure process may be performed on a resist layer (not illustrated) of the substrate SUB100. At least one optical member may be provided between the light source LS10 and the reticle R100b and/or between the reticle R100b and the substrate SUB100. For example, a first optical system S110 may be provided between the light source LS10 and the reticle R100b. Also, a second optical system S210 may be provided between the reticle R100b and the substrate SUB100. The first optical system S110 may be an illuminating optical system, and the second optical system S210 may be a projection optical system. The configurations of the first optical system S110 and the second optical system S210 may be similar to the configurations of the first optical system S100 and the second optical system S200, respectively. In some example embodiments, the lithography process (exposure process) may be performed while moving the reticle R100b in a horizontal direction and/or moving the substrate SUB100 in a horizontal direction.

FIG. 27 illustrates a case where the lithography process is performed in a state in which the pellicle P100b is disposed under the photomask PM10b, but in some cases, the lithography process may be performed in a state in which the pellicle P100b is disposed above the photomask PM10b. In other words, in FIG. 27, the lithography process may be performed in a state in which the reticle R100b is upside down.

The reticles R100a and R100b may be repeatedly used in the lithography apparatuses (exposure apparatuses for lithography) illustrated in FIGS. 25 to 27. When the number of uses of the reticles R100a and R100b is equal to or greater than a certain threshold value, the life of the pellicles P100a and P100b may be expired. The expired pellicles P100a and P100b may be replaced with new pellicles, or the reticles R100a and R100b themselves may be replaced with new reticles. Since the pellicles P100a and P100b according to some example embodiments have excellent durability, light resistance, and stability, the pellicles P100a and P100b may be used for long periods of time. Also, since the pellicles P100a and P100b have high transmittance and excellent uniformity, it is possible to improve uniformity and precision of the lithography process.

A case where the pellicles P100a and P100b according to some example embodiments are used for EUV lithography has been illustrated and described above, but in some cases, the pellicles P100a and P100b may be used in a lithography process using light of another wavelength region, except for EUV light. For example, the pellicles P100a and P100b may be used for deep ultraviolet (DUV) light or light of other wavelength regions.

It will be understood by those of ordinary skill in the art that the configurations of the pellicles for a photomask described with reference to FIGS. 1 to 5 and 9 to 21 may be variously changed, and the configurations of the reticles and lithography apparatuses described with reference to FIGS. 22 to 27 may be variously modified.

It should be understood that example embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A structure comprising:
a metal layer having a crystal plane, and
a pellicle membrane including a nanocrystalline graphene sheet formed on the metal layer and having a lattice structure that is irregular due to defects.

2. The structure of claim 1, wherein the nanocrystalline graphene sheet comprises a plurality of nanoscale crystal grains, and the plurality of nanoscale crystal grains include a two-dimensional (2D) carbon structure having an aromatic ring structure.

3. The structure of claim 1, wherein the defects of the nanocrystalline graphene sheet include at least one of an sp3 carbon (C) atom, an oxygen (O) atom, a nitrogen (N) atom, or a carbon vacancy.

4. The structure of claim 1, wherein a D/G intensity ratio in a Raman spectrum of the nanocrystalline graphene sheet is about 0.5 or more.

5. The structure of claim 1, wherein a 2D/G intensity ratio in a Raman spectrum of the nanocrystalline graphene sheet is about 0.05 or more.

6. The structure of claim 1, wherein an amount of oxygen (O) in the nanocrystalline graphene sheet is in a range of about 1 at % to about 20 at %.

7. The structure of claim 1, wherein an amount of hydrogen (H) in the nanocrystalline graphene sheet is in a range of about 1 at % to about 20 at %.

8. The structure of claim 1, wherein an amount of nitrogen (N) in the nanocrystalline graphene sheet is in a range of about 1 at % to about 20 at %.

9. The structure of claim 1, wherein the nanocrystalline graphene sheet has an irregular lattice structure in a C-axis direction.

10. The structure of claim 1, wherein the nanocrystalline graphene sheet has a density of less than about 2.2 g/cm3.

11. The structure of claim 1, wherein an interlayer spacing (d-spacing) of the nanocrystalline graphene sheet, as obtained through X-ray diffraction analysis, is greater than about 3.35 Å.

12. The structure of claim 1, wherein the nanocrystalline graphene sheet has a surface roughness of less than about 10 nm.

13. The structure of claim 1, wherein the pellicle membrane has a thickness of about 100 nm or less.

14. The structure of claim 1, wherein the pellicle membrane has a transmittance of about 80% or more with respect to extreme ultraviolet (EUV) light.

15. The structure of claim 1, wherein the pellicle membrane further includes a protective layer on at least one surface of the nanocrystalline graphene sheet.

16. The structure of claim 15, wherein the protective layer includes at least one of a carbon-based material, a metal chalcogenide-based material, a silicon derivative, or a metal oxide.

17. The structure of claim 16, wherein the carbon-based material includes at least one of amorphous carbon, graphene, nano-graphite, carbon nanosheet, carbon nanotube, silicon carbide (SiC), or boron carbide (B4C).

18. The structure of claim 16, wherein the metal chalcogenide-based material includes a transition metal dichalcogenide (TMD).

19. The structure of claim 16, wherein
the metal chalcogenide-based material includes a metal and a chalcogen element,
the metal is one of Mo, W, Nb, V, Ta, Ti, Zr, Hf, Tc, Re, Cu, Ga, In, Sn, Ge, or Pb, and
the chalcogen element includes one of S, Se, or Te.

20. The structure of claim 1, further comprising:
a pellicle frame supporting the pellicle membrane, wherein
the pellicle frame is at an edge portion of the pellicle membrane.

21. The structure of claim 20, further comprising:
a bonding layer between the pellicle membrane and the pellicle frame.

22. A reticle comprising:
a photomask; and
the structure of claim 1, configured to protect the photomask.

23. The reticle of claim 22, wherein the pellicle membrane is spaced apart from the photomask by about 1 mm to about 10 mm.

24. The reticle of claim 22, wherein the reticle is a transmissive reticle.

25. The reticle of claim 22, wherein the reticle is a reflective reticle.

26. The reticle of claim 22, wherein the reticle is a reticle configured for extreme ultraviolet (EUV) lithography.

27. An exposure apparatus for lithography, comprising:
a light source configured to generate light; and
a reticle in a traveling path of the light generated by the light source,
wherein the reticle includes the structure of claim 1 and a photomask,
the photomask has a pattern to be transfer onto a substrate, and
the pellicle membrane of the structure is configured to protect the photomask.

28. The exposure apparatus of claim 27, further comprising:
at least one optical member between the reticle and a corresponding one of the light source and the substrate.

29. The exposure apparatus of claim 27, wherein the exposure apparatus is an extreme ultraviolet (EUV) exposure apparatus.

30. A pellicle for protecting a photomask, the pellicle comprising:
a structure of the pellicle;
a metal layer having a crystal plane; and
a pellicle membrane connected to the structure of the pellicle, the pellicle membrane including a nanocrystalline graphene sheet formed on the metal layer and having a lattice structure that is irregular due to defects.

31. The pellicle of claim 30, wherein
the structure of the pellicle is a pellicle frame, and
the pellicle frame is disposed at an edge portion of the pellicle membrane to support the pellicle membrane.

32. The pellicle of claim 30, wherein the defects of the nanocrystalline graphene sheet include at least one of an sp3 carbon (C) atom, an oxygen (O) atom, a nitrogen (N) atom, or a carbon vacancy.

33. The pellicle of claim 30, wherein the nanocrystalline graphene sheet includes oxygen (O) in a range of about 1 at % to about 20 at %, hydrogen (H) in a range of about 1 at % to about 20 at %, or nitrogen (N) in a range of about 1 at % to about 20 at %.

34. A reticle comprising:
the pellicle of claim 30; and
the photomask.

* * * * *